(12) United States Patent
Teng

(10) Patent No.: US 12,489,465 B2
(45) Date of Patent: Dec. 2, 2025

(54) METHOD AND APPARATUS FOR PERFORMING DATA ACCESS CONTROL FOR HOST DEVICE

(71) Applicant: Silicon Motion, Inc., Hsinchu County (TW)

(72) Inventor: Duen-Yih Teng, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 18/740,578

(22) Filed: Jun. 12, 2024

(65) Prior Publication Data

US 2025/0096817 A1 Mar. 20, 2025

(30) Foreign Application Priority Data

Sep. 19, 2023 (TW) ................................. 112135704

(51) Int. Cl.
*H03M 13/11* (2006.01)
*H03M 13/00* (2006.01)

(52) U.S. Cl.
CPC ...... *H03M 13/1111* (2013.01); *H03M 13/611* (2013.01)

(58) Field of Classification Search
CPC ......... H03M 13/3715; H03M 13/1128; H03M 13/611; H03M 13/1102; H03M 13/116; H03M 13/3723; H03M 13/1111
See application file for complete search history.

(56) References Cited

U.S. PATENT DOCUMENTS

| | | | | |
|---|---|---|---|---|
| 8,024,641 | B2 * | 9/2011 | Livshitz | H03M 13/6368 |
| | | | | 714/752 |
| 10,567,002 | B2 * | 2/2020 | Shutkin | H03M 13/6561 |
| 11,595,060 | B2 * | 2/2023 | Kim | H03M 13/116 |
| 12,149,260 | B2 * | 11/2024 | Kuo | G06F 11/10 |
| 2008/0320246 | A1 | 12/2008 | Fuhler | |
| 2017/0063397 | A1 | 3/2017 | Richardson | |

FOREIGN PATENT DOCUMENTS

| | | |
|---|---|---|
| CN | 106681856 A | 5/2017 |
| TW | 201939903 A | 10/2019 |
| TW | 202209310 A | 3/2022 |
| TW | I805509 B | 6/2023 |

\* cited by examiner

*Primary Examiner* — Justin R Knapp
(74) *Attorney, Agent, or Firm* — Winston Hsu

(57) ABSTRACT

A method for performing data access control for a host device includes: receiving a plurality of host commands from the host device, for performing data access on at least one medium according to the plurality of host commands, wherein the data access includes data receiving; and performing a data access optimization procedure for maintaining correctness of the data receiving that includes: performing the data receiving on the at least one medium to obtain at least one code word; performing multiple first low-density parity-check (LDPC) code decoding operations regarding multiple column segments, where a portion of column segments are abnormal column segments corresponding to puncture variable nodes; finding at least one column segment satisfying predetermined selection condition, to perform at least one second LDPC code decoding operation regarding the at least one column segment; performing multiple third LDPC code decoding operations regarding the multiple column segments; and returning error-free data.

19 Claims, 21 Drawing Sheets

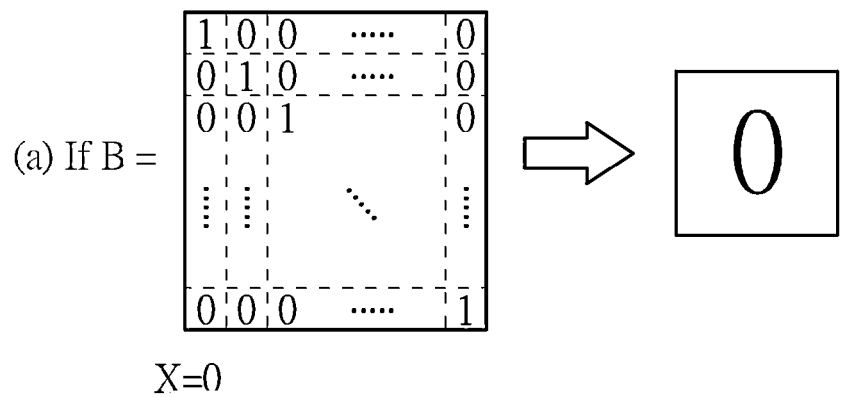
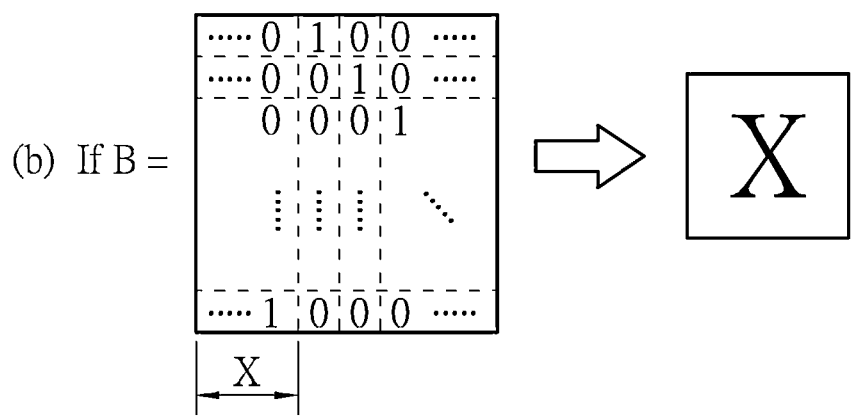
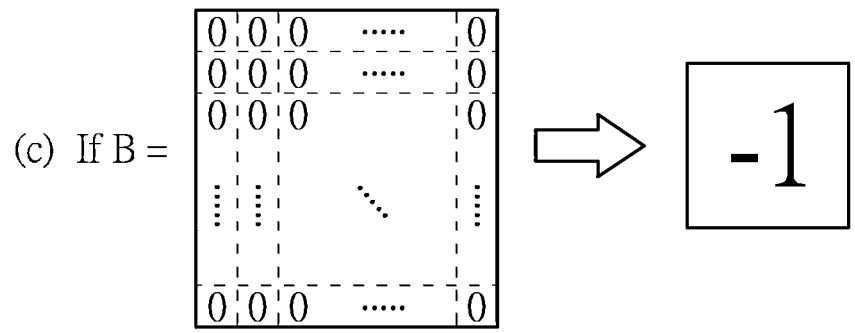
FIG. 5B

|  $B_{0,6}$ | $B_{1,6}$ | $B_{2,6}$ | $B_{3,6}$ |
|---|---|---|---|
| $B_{0,5}$ | $B_{1,5}$ | $B_{2,5}$ | $B_{3,5}$ |
| $B_{0,4}$ | $B_{1,4}$ | $B_{2,4}$ | $B_{3,4}$ |
| $B_{0,3}$ | $B_{1,3}$ | $B_{2,3}$ | $B_{3,3}$ |
| $B_{0,2}$ | $B_{1,2}$ | $B_{2,2}$ | $B_{3,2}$ |
| $B_{0,1}$ | $B_{1,1}$ | $B_{2,1}$ | $B_{3,1}$ |
| $B_{0,0}$ | $B_{1,0}$ | $B_{2,0}$ | $B_{3,0}$ | e.g., F = 4 and G = 7

(7*Z) vertical, (4*Z) horizontal

FIG. 5C

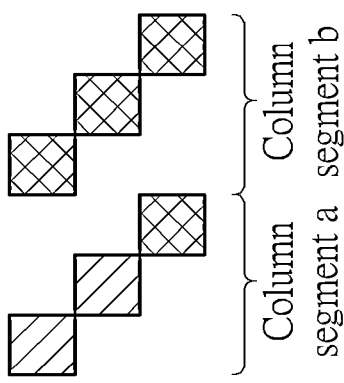

For example:
Z=3

⟋ Elements corresponding to normal variable nodes and being equal to 1 in parity check matrix H ⨯ Elements corresponding to puncture variable nodes and being equal to 1 in parity check matrix H Predetermined selection condition:

$$\underset{s\in\varphi}{\operatorname{argmin}}|\{(c,v)|\forall c, v\in N(c), v\in s, \min_{n\in N(c)\backslash v}|L_{cn}|=0\}|$$

wherein column segment b satisfies above condition

FIG. 9

METHOD AND APPARATUS FOR PERFORMING DATA ACCESS CONTROL FOR HOST DEVICE

BACKGROUND OF THE INVENTION

1. Field of the Invention

The present invention is related to memory control, and more particularly, to a method for performing data access control for a host device, and an associated apparatus (e.g., a data access device, a controller within the data access device, and an electronic device including the data access device).

2. Description of the Prior Art

Access management of a memory device including a flash memory for storing data may be complicated. The memory device may be a memory card, a solid state drive (SSD), or an embedded storage device such as that conforming to universal flash storage (UFS) specification. When manufacturers try to use degraded flash memory dies to reduce overall costs, certain problems may occur. More particularly, the degraded flash memory dies have unstable characteristics and are prone to data errors, which may result in reduced overall performance of the memory device. Related art solutions have tried to correct the problem, but further problems may be introduced. For example, under a condition that an uncorrectable error occurs, trying to recover data by using a stronger data processing mechanism may take a lot of time.

Thus, a novel method and associated architecture are needed for solving the problems without introducing any side effect or in a way that is less likely to introduce a side effect.

SUMMARY OF THE INVENTION

It is therefore one of the objectives of the present invention to provide a method for performing data access control for a host device, and an associated apparatus (e.g., a data access device, a controller within the data access device, and an electronic device including the data access device), to address the above-mentioned issues.

According to at least one embodiment of the present invention, a method for performing data access control for a host device is provided, wherein the method may be applied to a controller of a data access device. The method may comprise: receiving a plurality of host commands from the host device, for performing data access upon at least one medium according to the plurality of host commands, wherein the data access comprises data receiving; and performing a data access optimization procedure for maintaining correctness of the data receiving. For example, the data access optimization procedure may comprise: performing the data receiving upon the at least one medium to obtain at least one code word, wherein the at least one code word comprises multiple column segments; in a first decoding phase, performing multiple first low-density parity-check (LDPC) code decoding operations regarding the multiple column segments, wherein a portion of column segments among the multiple column segments are abnormal column segments corresponding to puncture variable nodes; in a second decoding phase, finding at least one column segment satisfying at least one predetermined selection condition, to perform at least one second LDPC code decoding operation regarding the at least one column segment; in a third decoding phase, performing multiple third LDPC code decoding operations regarding the multiple column segments; and after decoding is completed, returning error-free data corresponding to the at least one code word to the host device.

In addition to the above method, the present invention also provides a controller of a data access device, wherein the data access device may be arranged to perform data access control for a host device. In addition, the controller may comprise a processing circuit, a transmission interface circuit, and an LDPC code decoding circuit, wherein the processing circuit is arranged to control the controller according to a plurality of host commands from the host device, to allow the host device to access at least one medium through the controller, the transmission interface circuit is arranged to perform communications with the host device, and the LDPC code decoding circuit is arranged to perform LDPC code decoding. In addition, the controller receives the plurality of host commands from the host device through the transmission interface circuit within the controller, for performing data access upon the at least one medium according to the plurality of host commands, wherein the data access comprises data receiving. The controller performs a data access optimization procedure for maintaining correctness of the data receiving. For example, the data access optimization procedure comprises: performing the data receiving upon the at least one medium to obtain at least one code word, wherein the at least one code word comprises multiple column segments; in a first decoding phase, utilizing the LDPC code decoding circuit to perform multiple first LDPC code decoding operations regarding the multiple column segments, wherein a portion of column segments among the multiple column segments are abnormal column segments corresponding to puncture variable nodes; in a second decoding phase, utilizing the LDPC code decoding circuit to find at least one column segment satisfying at least one predetermined selection condition, to perform at least one second LDPC code decoding operation regarding the at least one column segment; in a third decoding phase, utilizing the LDPC code decoding circuit to perform multiple third LDPC code decoding operations regarding the multiple column segments; and after decoding is completed, returning error-free data corresponding to the at least one code word to the host device.

In addition to the method mentioned above, the present invention also provides a data access device comprising the controller mentioned above, wherein the data access device comprises: the controller, which is arranged to control operations of the data access device.

In addition to the method mentioned above, the present invention also provides an electronic device comprising the data access device mentioned above, wherein the electronic device further comprises the host device that is coupled to the data access. The host device may comprise: at least one processor, arranged to control operations of the host device; and a power supply circuit, coupled to the at least one processor, arranged to provide power to the at least one processor and the data access device.

The method and apparatus of the present invention can guarantee that the memory device can operate properly in various situations, and more particularly, can ensure data correctness. Although degraded flash memory dies have unstable characteristics, the method and apparatus of the present invention can perform at least one read retry operation to obtain related information for performing soft decoding. For example, the method and apparatus of the present invention can find at least one column segment satisfying at least one predetermined selection condition during the soft decoding, and can decode the at least one column segment in a higher priority order, in order to control rapid convergence of related decoding parameters to improve overall decoding speed. In this way, under a condition that abnormal column segments corresponding to puncture variable nodes exist, overall data access performance can be improved greatly. In addition, the method and apparatus of the present invention can solve the related art problems without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5B is a diagram illustrating multiple conditions of the fundamental matrix shown in FIG. 5A according to an embodiment of the present invention.

FIG. 5C is a diagram illustrating multiple fundamental matrices within the parity check matrix shown in FIG. 5A according to an embodiment of the present invention.

FIG. 9 is a diagram illustrating a relationship between some to-be-processed column segments and elements within the parity check matrix in the method according to an embodiment of the present invention.

DETAILED DESCRIPTION

Figure 1:
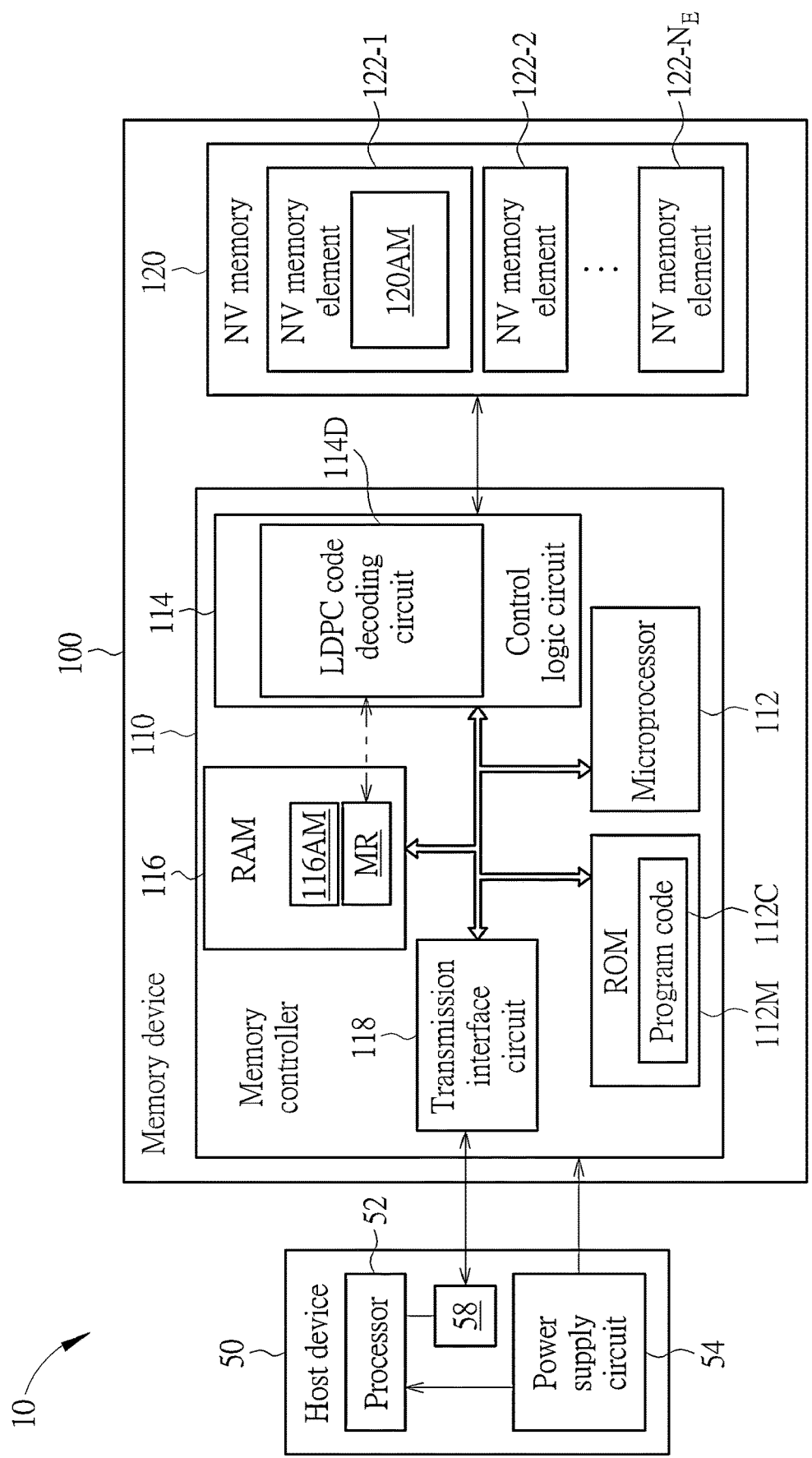
FIG. 1 is a diagram illustrating an electronic device according to an embodiment of the present invention.

FIG. 1 is a diagram illustrating an electronic device 10 according to an embodiment of the present invention, where the electronic device 10 may include a host device 50 and a memory device 100. The host device 50 may include at least one processor (e.g., one or more processors) which may be collectively referred to as the processor 52, a power supply circuit 54, and a transmission interface circuit 58, wherein the processor 52 and the transmission interface circuit 58 may be coupled to each other through a bus, and may be coupled to the power supply circuit 54 to obtain power. The processor 52 may be arranged to control operations of the host device 50, and the power supply circuit 54 may be arranged to provide the processor 52, the transmission interface circuit 58, and the memory device 100 with power, and output one or more driving voltages to the memory device 100, wherein the memory device 100 may provide the host device 50 with storage space, and may obtain the one or more driving voltages from the host device 50 to power the memory device 100. Examples of the host device 50 may include, but are not limited to: a multifunctional mobile phone, a tablet computer, a wearable device, and a personal computer such as a desktop computer and a laptop computer. Examples of the memory device 100 may include, but are not limited to: a portable memory device (e.g., a memory card conforming to the SD/MMC, CF, MS or XD specification), a solid state drive (SSD), and various types of embedded memory devices (e.g., an embedded memory device conforming to the UFS or embedded multi-media card (eMMC) specification). According to this embodiment, the memory device 100 may include a controller such as a memory controller 110, and may further include a non-volatile (NV) memory 120, wherein the memory controller 110 is arranged to access the NV memory 120, and the NV memory 120 is arranged to store information. The NV memory 120 may include at least one NV memory element (e.g., one or more NV memory elements), such as a plurality of NV memory elements 122-1, 122-2, . . . , and 122-$N_E$, wherein "$N_E$" may represent a positive integer that is greater than one. For example, the NV memory 120 may be a flash memory, and the plurality of NV memory elements 122-1, 122-2, . . . , and 122-$N_E$ may be a plurality of flash memory chips or a plurality of flash memory dies, but the present invention is not limited thereto.

As shown in FIG. 1, the memory controller 110 may include a processing circuit such as a microprocessor 112, a storage unit such as a read only memory (ROM) 112M, a control logic circuit 114, a random access memory (RAM) 116, and a transmission interface circuit 118, wherein at least one portion (e.g., a portion or all) of the above components may be coupled to one another via a bus. The RAM 116 may be arranged to provide the memory controller 110 with internal storage space (for example, may temporarily store information), wherein the RAM 116 may be implemented by way of static random access memory (SRAM), but the present invention is not limited thereto. In addition, the ROM 112M of this embodiment is arranged to store a program code 112C, and the microprocessor 112 is arranged to execute the program code 112C to control the access of the NV memory 120. Note that the program code 112C may also be stored in the RAM 116 or any type of memory. Additionally, the control logic circuit 114 may be arranged to control the NV memory 120. The transmission interface circuit 118 may conform to one or more communications specifications among various communications specifications (e.g., the Serial Advanced Technology Attachment (SATA) specification, Universal Serial Bus (USB) specification, Peripheral Component Interconnect Express (PCIe) specification, embedded Multi Media Card (eMMC) specification, and Universal Flash Storage (UFS) specification), and may perform communications with the host device 50 (e.g., the transmission interface circuit 58) according to the one or more communications specifications for the memory device 100. Similarly, the transmission interface circuit 58 may conform to the one or more communications specifications, and may perform communications with the memory device 100 (e.g., the transmission interface circuit 118) according to the one or more communications specification for the host device 50.

In this embodiment, the host device 50 may transmit a plurality of host commands and corresponding logical addresses to the memory controller 110, to indirectly access the NV memory 120 within the memory device 100. The memory controller 110 receives the plurality of host commands and the logical addresses, and respectively translates the plurality of host commands into memory operating commands (which may be referred to as operating commands for brevity), and further controls the NV memory 120 with the operating commands to perform reading or writing/programing upon the memory units or data pages of specific physical addresses within the NV memory 120, wherein the physical addresses can be associated with the logical addresses. For example, the memory controller 110 may generate or update at least one logical-to-physical (L2P) address mapping table to manage the relationships between the physical addresses and the logical addresses. The NV memory 120 may store a global L2P address mapping table 120AM, for the memory controller 110 to control the memory device 100 to access data in the NV memory 120, but the present invention is not limited thereto. For better comprehension, the global L2P address mapping table 120AM may be located in a predetermined region within the NV memory element 122-1, such as a system region, but the present invention is not limited thereto. For example, the global L2P address mapping table 120AM may be divided into a plurality of local L2P address mapping tables, and the plurality of local L2P address mapping tables may be stored in one or more of the NV memory elements 122-1, 122-2, . . . , and 122-$N_E$, and more particularly, may be stored in the NV memory elements 122-1, 122-2, . . . , and 122-$N_E$, respectively. When there is a need, the memory controller 110 may load at least one portion (e.g., a portion or all) of the global L2P address mapping table 120AM into the RAM 116 or other memories. For example, the memory controller 110 may load a local L2P address mapping table among the plurality of local L2P address mapping tables into the RAM 116 to be a temporary L2P address mapping table 116AM, for accessing data in the NV memory 120 according to the local L2P address mapping table which is stored as the temporary L2P address mapping table 116AM, but the present invention is not limited thereto.

In addition, the aforementioned at least one NV memory element (e.g., the one or more NV memory elements such as {122-1, 122-2, . . . , 122-$N_E$}) may include a plurality of blocks {BLK}, wherein the minimum unit that the memory controller 110 may perform operations of erasing data upon the NV memory 120 may be a block, and the minimum unit that the memory controller 110 may perform operations of writing data upon the NV memory 120 may be a page, but the present invention is not limited thereto. For example, any NV memory element 122-$n_E$ (where "$n_E$" may represent any integer in the interval [1, $N_E$]) within the NV memory elements 122-1, 122-2, . . . , and 122-$N_E$ may include multiple blocks, and a block among the multiple blocks may include and record a specific number of pages, wherein the memory controller 110 may access a certain page of a certain block among the multiple blocks according to a block address and a page address.

According to some embodiments, the control logic circuit 114 may include a randomization circuit and an error correction code (ECC) circuit (not shown in FIG. 1), wherein the randomization circuit may perform randomization upon the write data (e.g., the data to be written into the NV memory 120, during performing writing/programming upon the NV memory 120 in response to a write command from the host device 50) and perform de-randomization upon the read data (e.g., the data read from the NV memory 120 during performing reading upon the NV memory 120 in response to a read command from the host device 50), and the ECC circuit may perform ECC encoding upon the write data and perform ECC decoding upon the read data, in order to protect data and/or perform error correction, but the present invention is not limited thereto. For example, the NV memory elements 122-1, 122-2, . . . , and 122-$N_E$ may be implemented by degraded flash memory dies. Under this situation, the ECC decoding may not be successful, and more particularly, uncorrectable ECC (UECC) errors may occur. The memory controller 110 may be equipped with a more robust read mechanism to avoid the high error rates caused by using the degraded flash memory dies.

In the architecture shown in FIG. 1, the control logic circuit 114 may include multiple data processing sub-circuits to provide the above-mentioned more robust read mechanism, and the multiple data processing sub-circuits may include at least one low-density parity-check (LDPC) code decoding circuit 114D, such as one or more LDPC code decoding circuits {114D}, wherein the at least one LDPC code decoding circuit 114D may perform an access operation upon read data buffered in at least one memory region MR, to perform related decoding operations for obtaining and returning error-free data to the host device 50, but the present invention is not limited thereto. According to some embodiments, the architecture shown in FIG. 1 may vary. For example, at least one portion (e.g., a portion or all) of the multiple data processing sub-circuits, such as the one or more LDPC code decoding circuits {114D}, may be integrated into at least one other circuit (rather than the control logic circuit 114).

Figure 2A:
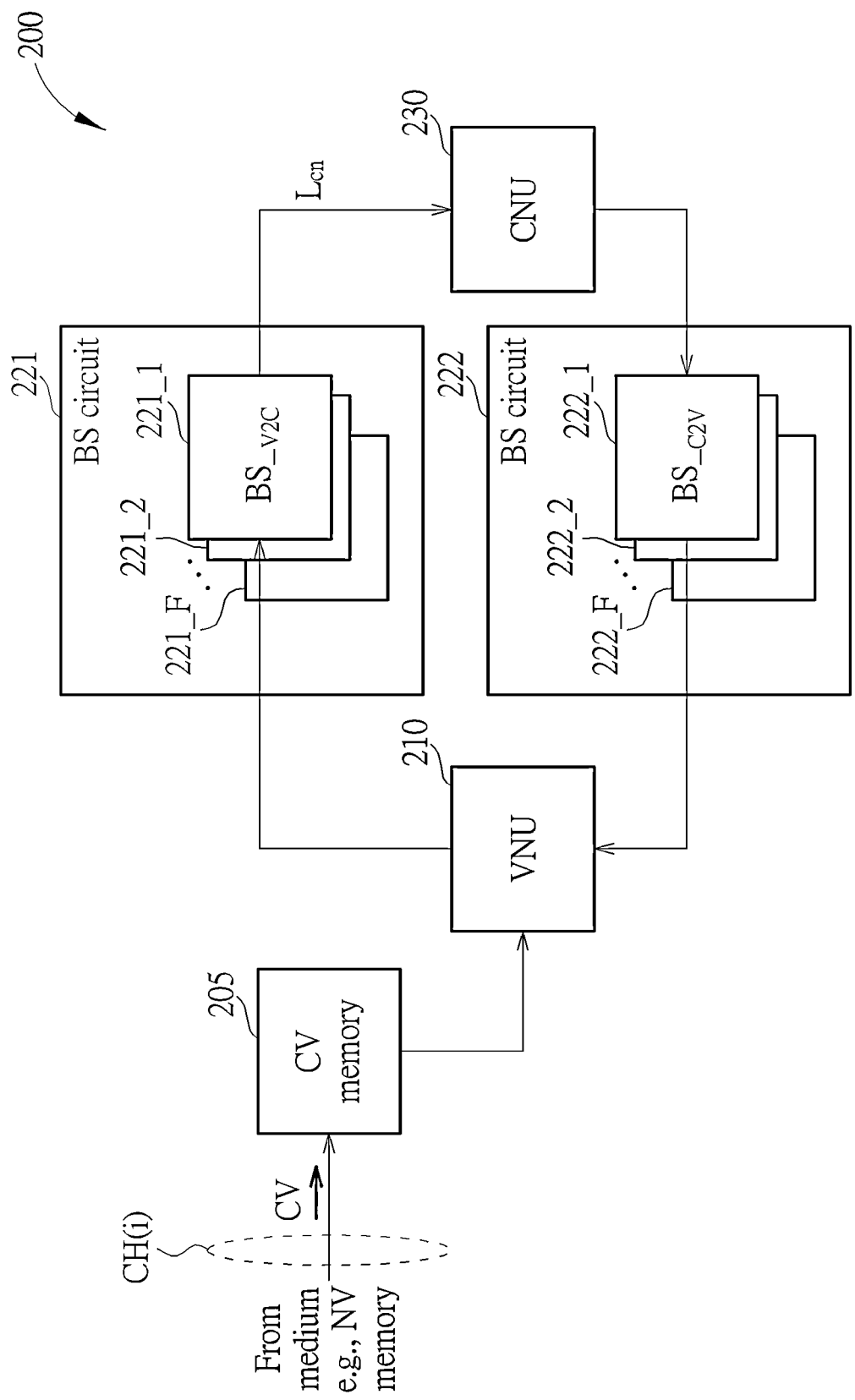
FIG. 2A is a diagram illustrating an LDPC code decoding control scheme according to an embodiment of the present invention.

FIG. 2A is a diagram illustrating an LDPC code decoding control scheme according to an embodiment of the present invention, wherein an LDPC code decoding circuit 200 may act as an example of the at least one LDPC code decoding circuit 114D, but the present invention is not limited thereto. During the read operation performed upon the NV memory 120 in response to the read command from the host device 50, the memory controller 110 may obtain multiple channel values {CV} from the NV memory 120 through at least one channel CH (e.g., one or more channels {CH}, such as multiple channels {CH(i)}), for the multiple data processing sub-circuits to perform related processing to obtain error-free data. For example, the memory controller 110 may perform a read optimization procedure to utilize the LDPC code decoding circuit 200 to receive the channel values {CV} from at least one medium (e.g., the NV memory 120), for performing related processing to generate error-free data.

Based on the LDPC code decoding control scheme shown in FIG. 2A, the multiple data processing sub-circuits within the memory controller 110 may include at least one LDPC code decoding circuit 200 corresponding to the at least one channel CH, and more particularly, may include multiple LDPC code decoding circuits {200} that correspond to the channels {CH(i)}, respectively. For example, the LDPC code decoding circuit 200 corresponding to a channel CH(i) among the LDPC code decoding circuits {200} may include an NV memory (e.g., a channel value (CV) memory 205) and a column-segment processing sub-circuit, and the column-segment processing sub-circuit may include a variable node unit (VNU) 210, multiple barrel shifter (BS) circuits 221 and 222, and a check node unit (CNU) 230, wherein it is assumed that "F" may represent a positive integer greater than one, BS circuit 221 may include a set of BSs {221_1, 221_2, ..., 221_F} on a path from the VNU 210 to the CNU 230 (labeled as "$BS_{V2C}$" for brevity), and the BS circuit 222 may include a set of BSs {222_1, 222_2, ..., 222_F} on a path from the CNU 230 to the VNU 210 (labeled as "$BS_{C2V}$" for brevity).

For better comprehension, the CV memory 205 may be implemented by the at least one memory region MR (e.g., one or more memory regions {MR}), and more particularly, the CV memory 205 may be implemented in the memory region MR corresponding to the channel CH{i} among multiple memory regions {MR} that correspond to the channels {CH{i}}, respectively, within the RAM 116, but the present invention is not limited thereto. According to some embodiments, the CV memory 205 may be implemented by a dedicated memory (e.g., other RAM).

Figure 2B:
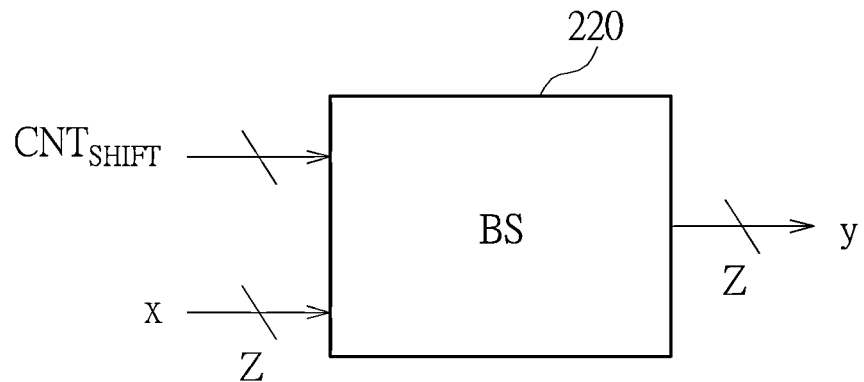
FIG. 2B is a diagram illustrating a barrel shifter involved in the LDPC code decoding control scheme shown in FIG. 2A according to an embodiment of the present invention.

FIG. 2B is a diagram illustrating a BS 220 involved in the LDPC code decoding control scheme shown in FIG. 2A according to an embodiment of the present invention, wherein the BS 220 may be an example of any of the set of BSs {221_1, 221_2, ..., 221_F}, and may also be an example of any of the set of BSs {222_1, 222_2, ..., 222_F}. Assume that "Z" may represent a positive integer greater than one, and the BS 220 may perform a $CNT_{SHIFT}$ shift operation upon an input signal x with Z bits according to a shift count $CNT_{SHIFT}$ to generate an output signal y with Z bits, but the present invention is not limited thereto. For example, the shift count $CNT_{SHIFT}$ may be an integer greater than or equal to zero. When $CNT_{SHIFT}=0$, the BS 220 may directly output the Z bits of the input signal x as the Z bits of the output signal y, so that the output signal y is equivalent to the input signal x. In addition, the Z bits of the input signal x may include input bits $x_0, x_1, \ldots,$ and $x_{Z-1}$, and the Z bits of the output signal y may include output bits $y_0, y_1, \ldots,$ and $y_{Z-1}$.

Figure 2C:
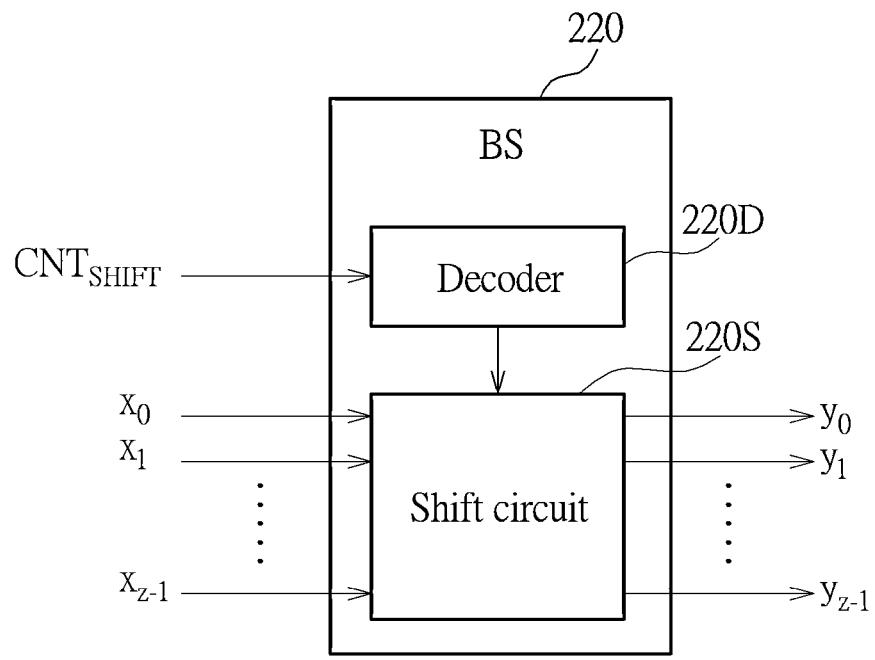
FIG. 2C is a diagram illustrating some implementation details of the barrel shifter shown in FIG. 2B according to an embodiment of the present invention.

FIG. 2C is a diagram illustrating some implementation details of the BS 220 shown in FIG. 2B according to an embodiment of the present invention. The BS 220 may include a decoder 220D and a shift circuit 220S. The decoder 220D may generate multiple shift control signals according to the shift count $CNT_{SHIFT}$, for controlling multiple shift sub-circuits within the shift circuit 220S to perform corresponding shift operations. The shift circuit 220S (or the multiple shift sub-circuits therein) may perform the corresponding shift operations upon the input bits $x_0, x_1, \ldots,$ and $x_{Z-1}$ according to the multiple shift control signals to generate the output bits $y_0, y_1, \ldots,$ and $y_{Z-1}$, but the present invention is not limited thereto. According to some embodiments, the architecture shown in FIG. 2C and/or related operations may vary.

Figure 3:
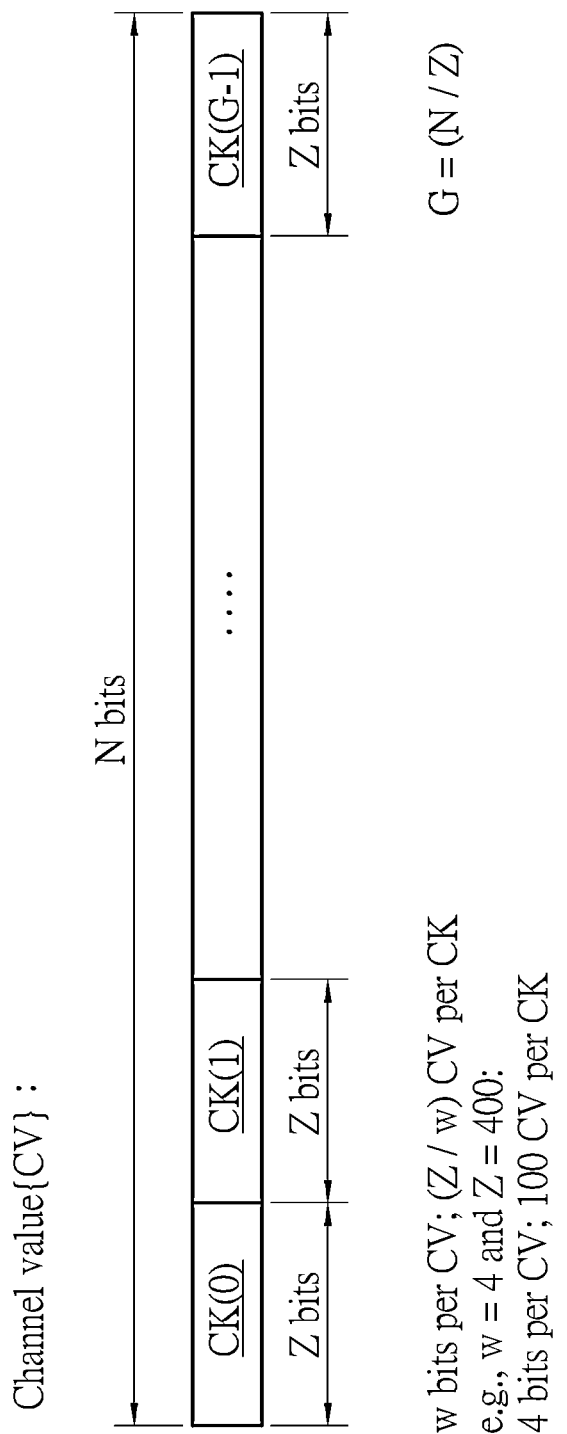
FIG. 3 is a diagram illustrating a code word involved in the LDPC code decoding control scheme shown in FIG. 2A according to an embodiment of the present invention.

FIG. 3 is a diagram illustrating a code word involved in the LDPC code decoding control scheme shown in FIG. 2A according to an embodiment of the present invention, wherein the code word may include a set of channel values {CV} included in the above-mentioned multiple channel values {CV}. Assume that "G" may represent a positive integer greater than one, and a total bit count of the code word may be equal to N. The overall N bits of the set of channel values {CV} may be divided into G data chunks CK(0), CK(1), ..., and CK(G−1), wherein if G=(N/Z), a length of each of the G data chunks CK(0), CK(1), ..., and CK(G−1) may be equal to Z bits for performing LDPC code decoding; and when any of multiple LDPC code decoding operations of the LDPC code decoding is implemented by multiple predetermined operations (e.g., a horizontal decoding operation and a vertical decoding operation) of a min-sum-algorithm-based column-layered decoding method, the G data chunks CK(0), CK(1), ..., and CK(G−1) may be utilized as G column segments, and may also be referred to as G column segments CK(0), CK(1), ..., and CK(G−1), but the present invention is not limited thereto. In addition, the code word may be configured as w bits per channel value and (Z/w) channel values per column segment (labeled as "w bits per CV; (Z/w) CV per CK" for brevity). Any channel value CV among the set of channel values {CV} of the code word may have w bits, and any column segment CK(g) (e.g., "g" may represent any integer in an interval [0, (G−1)]) among the G column segments CK(0), CK(1), ..., and CK(G−1) may have (Z/w) channel values {CV}. For example, when w=4 and Z=400, the code word may be configured as 4 bits per channel value and 100 channel values per column segment (labeled as "4 bits per CV; 100 CV per CK" for brevity).

Figure 4A:
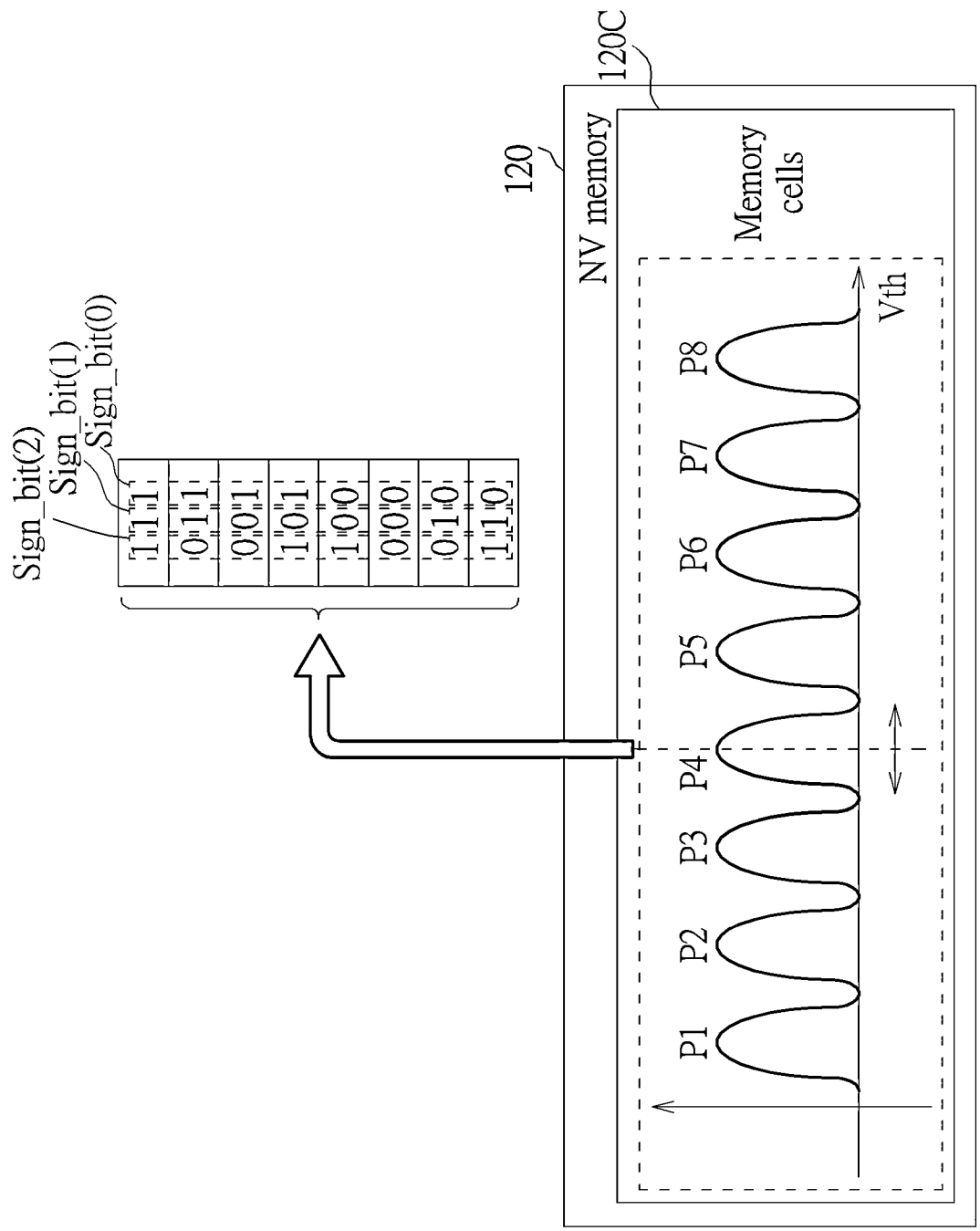
FIG. 4A is a diagram illustrating multiple sign bits involved in the LDPC code decoding control scheme shown in FIG. 2A according to an embodiment of the present invention.

FIG. 4A is a diagram illustrating multiple sign bits Sign_bit(0), Sign_bit(1), and Sign_bit(2) involved in the LDPC code decoding control scheme shown in FIG. 2A according to an embodiment of the present invention. A set of memory cells 120C within the NV memory 120 may be configured as J-level cells, and any memory cell among the set of memory cells 120C may be at a programming state P selected from multiple candidate programming states {P} (e.g., $2^J$ programming states {P1, ..., P2$^J$}). For example, when J=3, the set of memory cells 120C may be configured as 3-level cells, and any memory cell among the set of memory cells 120C may be at a programming state P selected from the multiple candidate programming states {P}(e.g., 8 programming states {P1, ..., P8}), wherein the horizontal axis shown in the lower half of FIG. 4A may represent a threshold voltage Vth, and the threshold voltage Vth may be referred to as a read voltage under some conditions, but the present invention is not limited thereto. According to some embodiments, the multiple candidate programming states {P1, ..., P8} shown in FIG. 4A and/or a level count J of the set of memory cells 120C may vary. For example, the level count J may be equal to any value among a series of values {1, 2, 3, 4, ...}.

As shown in the upper half of FIG. 4A, the memory controller 110 may refer to a predetermined programming rule to associate the $2^J$ programming states {P1, ..., P2$^J$} (e.g., the 8 programming states {P1, ..., P8}) with $2^J$ predetermined codes (e.g., the 8 predetermined codes {111, 011, 001, 101, 100, 000, 010, 110}), wherein any predetermined code among the $2^J$ predetermined codes may include J sign bits {Sign_bit(j) | j=0, ..., (J−1)} (e.g., 3 sign bits Sign_bit(0), Sign_bit(1), and Sign_bit(2)), but the present invention is not limited thereto. According to some embodiments, the predetermined programming rule, the $2^J$ predetermined codes (e.g., the 8 predetermined codes {111, 011, 001, 101, 100, 000, 010, 110} shown in FIG. 4A), and/or the level count J may vary.

Figure 4B:
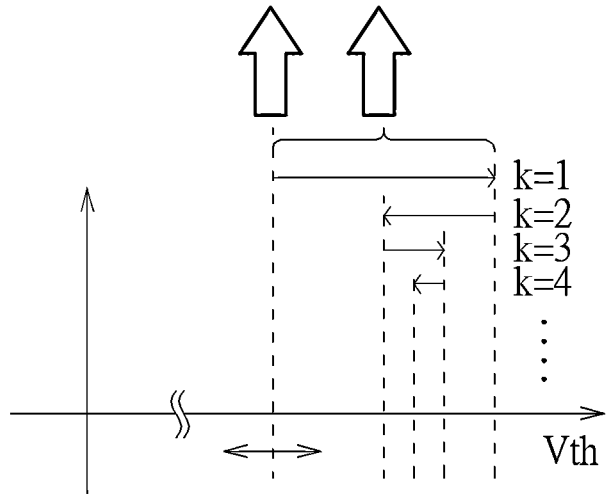
FIG. 4B is a diagram illustrating multiple soft bits and a sign bit involved in the LDPC code decoding control scheme shown in FIG. 2A according to an embodiment of the present invention.

FIG. 4B is a diagram illustrating (w−1) soft bits Soft_bit (j, k)|k=1, ..., (w−1)} and a sign bit Sign_bit(j) involved in the LDPC code decoding control scheme shown in FIG. 2A according to an embodiment of the present invention. For example, the w bits of the above-mentioned any channel value CV may include bits {Bit$_0$, Bit$_1$, Bit$_2$, ..., Bit$_{w-1}$}. During the read optimization procedure, the memory controller 110 may perform a first read operation to obtain the sign bit Sign_bit(j) for acting as the bit Bit$_0$, and perform a read retry procedure to perform multiple read retry operations to obtain the (w−1) soft bits {Soft_bit(j, k)|k=1, ..., (w−1)} for acting as the bits Bit$_1$, Bit$_2$, ..., and Bit$_{w-1}$, wherein the (w−1) soft bits {Soft_bit(j, k)|k=1, ..., (w−1)} may indicate how strong bit 1 or weak bit 1 the sign bit Sign_bit(j) is (if Sign_bit(j)=1), or how strong bit 0 or weak bit 0 the sign bit Sign_bit(j) is (if Sign_bit(j)=0); and according to some viewpoints, the soft bits {Soft_bit(j, k)|k=1, ..., (w−1)} may be arranged to accurately indicate a position of the programming state P associated with the sign bit Sign_bit(j) on the Vth axis, for improving the accuracy of detecting the position of the programming state P on the Vth axis, but the present invention is not limited thereto. For example, when k=1, the memory controller 110 may perform the 1$^{st}$ read retry operation to obtain the 1$^{st}$ soft bit Soft_bit(j, 1); when k=2, the memory controller 110 may perform the 2$^{nd}$ read retry operation to obtain the 2$^{nd}$ soft bit Soft_bit(j, 2); when k=3, the memory controller 110 may perform the 3$^{rd}$ read retry operation to obtain the 3$^{rd}$ soft bit Soft_bit(j, 3); when k=4, the memory controller 110 may perform the 4$^{th}$ read retry operation to obtain the 4$^{th}$ soft bit Soft_bit(j, 4); and the rest may be deduced by analogy.

For better comprehension, arrows corresponding to k=1, k=2, k=3, k=4, etc. may be illustrated in FIG. 4B for indicating related operations of detecting the position of the programming state P on the Vth axis, but the present invention is not limited thereto. According to some embodiments, these operations, related detecting directions (e.g., a positive direction or a negative direction), and/or related detecting positions on the Vth axis may vary.

Figure 5A:
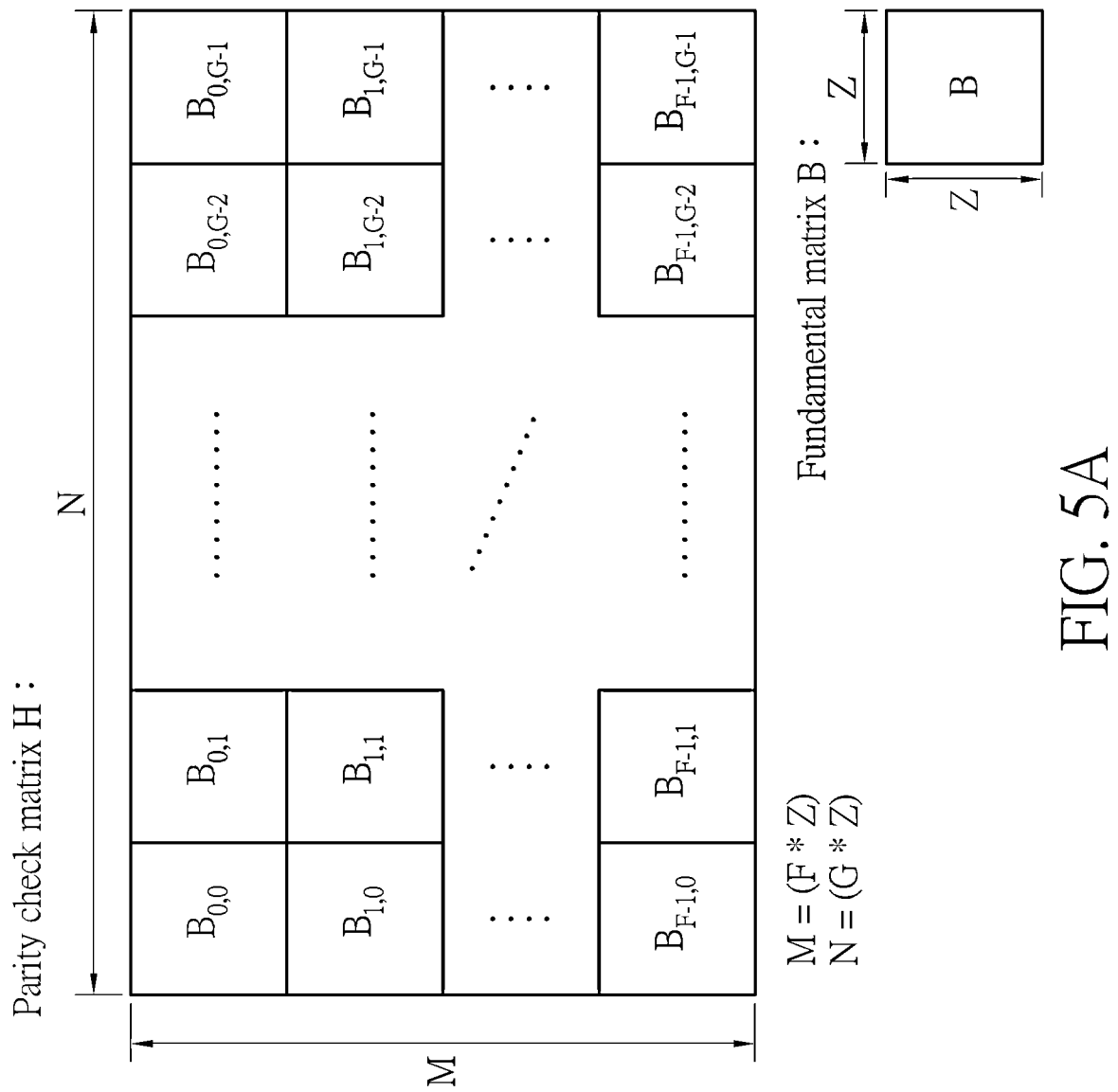
FIG. 5A is a diagram illustrating a parity check matrix involved in the LDPC code decoding control scheme shown in FIG. 2A according to an embodiment of the present invention, wherein a fundamental matrix is also illustrated in FIG. 5A for better comprehension.

FIG. 5A is a diagram illustrating a parity check matrix H involved in the LDPC code decoding control scheme shown in FIG. 2A according to an embodiment of the present invention, wherein a fundamental matrix B is also illustrated in FIG. 5A for better comprehension. The parity check matrix H may include multiple sub-matrices with the same size, and the multiple sub-matrices may be implemented as multiple fundamental matrices {B}, such as fundamental matrices {{B$_{0,0}$, B$_{0,1}$, ..., B$_{0,G-2}$, B$_{0,G-1}$}, {B$_{1,0}$, B$_{1,1}$, ..., B$_{1,G-2}$, B$_{1,G-1}$}, ..., {B$_{F-1,0}$, B$_{F-1,1}$, ..., B$_{F-1,G-2}$, B$_{F-1,G-1}$}}. For example, when M=(F*Z) and N=(G*Z), the parity check matrix H may have a size of (M*N) (or have (M*N) elements), and any of the multiple fundamental matrices {B}, such as the fundamental matrix B, may have a size of (Z*Z) (or have (Z*Z) elements).

FIG. 5B is a diagram illustrating multiple conditions of the fundamental matrix B shown in FIG. 5A according to an embodiment of the present invention. The fundamental matrix B may be an identity matrix I$_Z$ with a size Z (e.g., a matrix in which all elements on the main diagonal are 1 and the remaining elements are 0), an X-cyclically-shifted matrix of the identity matrix I$_Z$ (e.g., a matrix obtained by circularly shifting all elements of the identity matrix I$_Z$ to the right by a displacement X), or a zero matrix. For example, for a condition (a), if the fundamental matrix B is equal to the identity matrix I$_Z$, the fundamental matrix B may be labeled as "0" in the parity check matrix H, wherein no cyclically-shifted operation is required (labeled as "X=0" for better comprehension). For a condition (b), if the fundamental matrix B is equal to the X-cyclically-shifted matrix, the fundamental matrix B may be labeled as "X" in the parity check matrix H. For a condition (c), if the fundamental matrix B is equal to the zero matrix, the fundamental matrix B may be labeled as "−1" in the parity check matrix H.

FIG. 5C is a diagram illustrating multiple fundamental matrices {{B$_{0,0}$, B$_{0,1}$, B$_{0,2}$, B$_{0,3}$, B$_{0,4}$, B$_{0,5}$, B$_{0,6}$}, {B$_{1,0}$, B$_{1,1}$, B$_{1,2}$, B$_{1,3}$, B$_{1,4}$, B$_{1,5}$, B$_{1,6}$}, {B$_{2,0}$, B$_{2,1}$, B$_{2,2}$, B$_{2,3}$, B$_{2,4}$, B$_{2,5}$, B$_{2,6}$}, {B$_{3,0}$, B$_{3,1}$, B$_{3,2}$, B$_{3,3}$, B$_{3,4}$, B$_{3,5}$, B$_{3,6}$}} within the parity check matrix H shown in FIG. 5A according to an embodiment of the present invention, wherein F=4 and G=7, but the present invention is not limited thereto. For brevity, similar descriptions for this embodiment are not repeated in detail here.

Figure 5D:
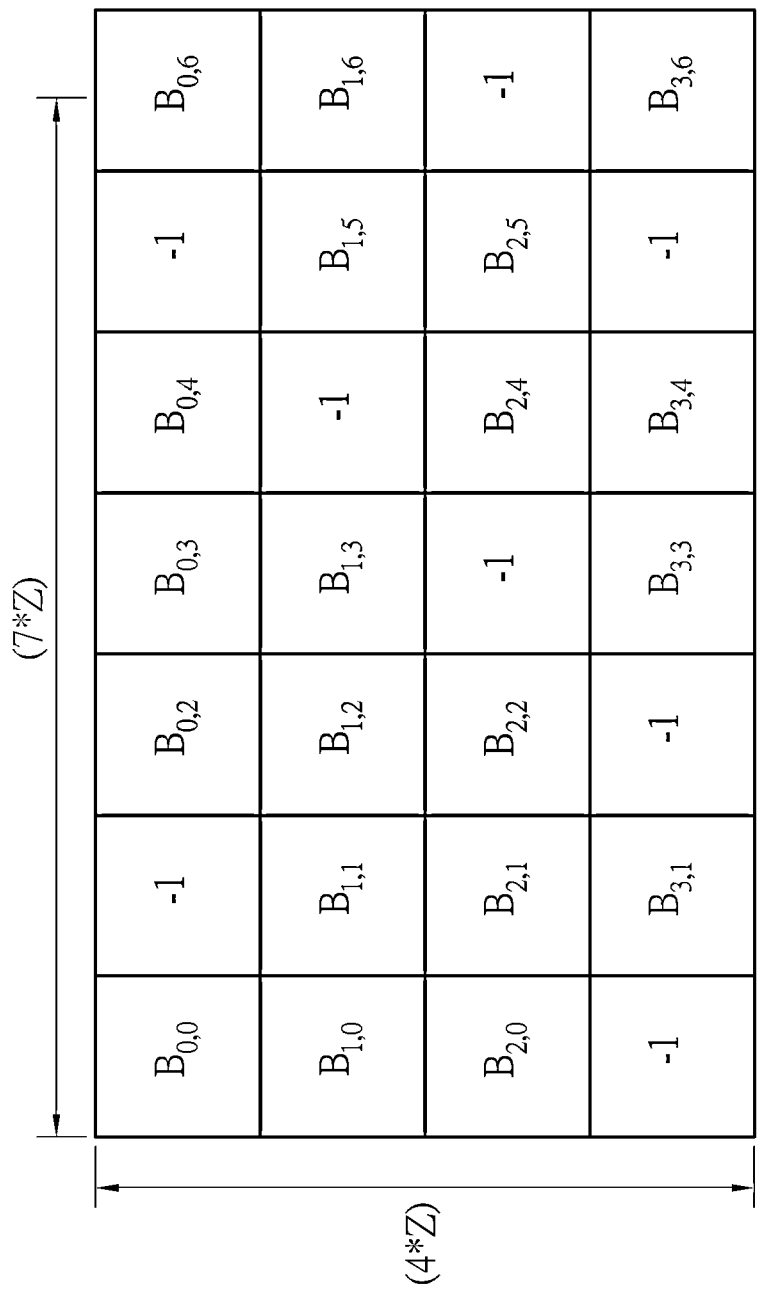
FIG. 5D is a diagram illustrating a condition that a portion of the multiple fundamental matrices shown in FIG. 5C are zero matrices according to an embodiment of the present invention.

FIG. 5D is a diagram illustrating a condition that a portion of the multiple fundamental matrices {{B$_{0,0}$, B$_{0,1}$, B$_{0,2}$, B$_{0,3}$, B$_{0,4}$, B$_{0,5}$, B$_{0,6}$}, {B$_{1,0}$, B$_{1,1}$, B$_{1,2}$, B$_{1,3}$, B$_{1,4}$, B$_{1,5}$, B$_{1,6}$}, {B$_{2,0}$, B$_{2,1}$, B$_{2,2}$, B$_{2,3}$, B$_{2,4}$, B$_{2,5}$, B$_{2,6}$}, {B$_{3,0}$, B$_{3,1}$, B$_{3,2}$, B$_{3,3}$, B$_{3,4}$, B$_{3,5}$, B$_{3,6}$}} shown in FIG. 5C are zero matrices (labeled as "−1" for brevity) according to an embodiment of the present invention, but the present invention is not limited thereto. For brevity, similar descriptions for this embodiment are not repeated in detail here.

Some implementation details regarding the min-sum-algorithm-based column-layered decoding method may be described as follows. According to some embodiments, assume that C is a binary (N, K) LDPC code specified by the parity check matrix H. In the parity check matrix H, any row among multiple rows may be associated with a check node c, and any column among multiple columns may be associated with a variable node v. Assume that N(c)={v:H$_{cv}$=1} represents a set of all variable nodes {v} that participate in the check node c (or are connected to the check node c through the parity check matrix H), and M(v)={c:H$_{cv}$=1} represents a set of all check nodes {c} that are associated with the variable node v (or are connected to the variable node v through the parity check matrix H). Assume that $I_v$ represents an intrinsic message for the variable node v, $R_{cv}$ represents a check-to-variable message conveyed from the check node c to the variable node v, and $L_{cv}$ represents a variable-to-check message conveyed from the variable node v to the check node c. Assume that the N bits of the code word are divided into G groups $\{N_0, N_1, \ldots, N_{G-1}\}$ with the same size (e.g., the G column segments CK(0), CK(1), ..., and CK(G−1) shown in FIG. 3). In this way, the parity check matrix H may be divided into G block columns. For better comprehension, take at least one set of pseudo codes as an example. The min-sum-algorithm-based column-layered decoding method may include the following operations:

---

(1) initialization:
$L_{cv} = I_v$ for v = 0, 1, ..., (N − 1), c = 0, 1, ..., (M − 1) ;
(2) iterative decoding:
For Iter = 1, 2, ..., Iter_maximum
{
For g = 0, 1, ..., (G − 1)
    {
    (2-1a) horizontal decoding operation (or horizontal step) :
    for each check node c connected to the variable node v∈$N_g$:

$$R_{cv} = \prod_{n \in N(c) \backslash v} \text{sgn}(L_{cn}) \times \min_{n \in N(c) \backslash v} |L_{cn}| \quad \text{Eq (1)}$$

(2-1b) vertical decoding operation (or vertical step) :
    for each variable node V∈$N_g$, update $L_{cv}$ and $L_v$ as follows:
    $L_{cv} = I_v + \alpha \times \Sigma_{m \in M(v) \backslash c} R_{mv}$   Eq (2)
    $L_v = I_v + \alpha \times \Sigma_{m \in M(v)} R_{mv}$   Eq (3)
    }
    (2-2) Hard decision and termination :
    the hard decision is made by using the sign of $L_v$; if a valid code word is found, the decoding is terminated.
}

--- wherein the two layers "For { }" within "iterative decoding" may represent For-loop, "Iter" may represent an iteration index, "Iter maximum" may represent a predetermined maximum value of the iteration index Iter, "sgn( )" may represent positive and negative signs, and "α" may represent a scaling factor, but the present invention is not limited thereto. According to some embodiments, the above-mentioned operations, related parameters of these operations, and/or the above-mentioned equations Eq(1), Eq(2), and Eq(3) may vary.

Figure 6A:
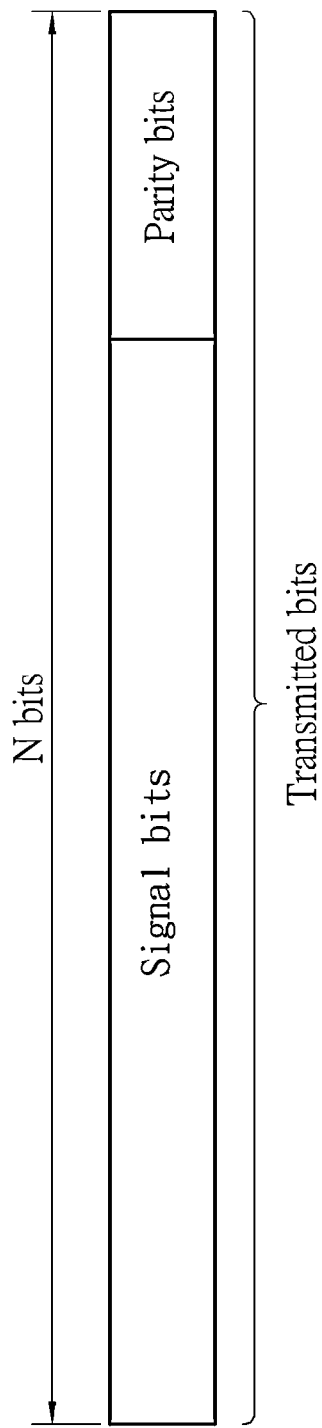
FIG. 6A is a diagram illustrating multiple parity bits and multiple signal bits within the code word involved in the LDPC code decoding control scheme shown in FIG. 2A according to an embodiment of the present invention.

FIG. 6A is a diagram illustrating multiple parity bits and multiple signal bits within the code word involved in the LDPC code decoding control scheme shown in FIG. 2A according to an embodiment of the present invention. For example, the code word may be completely transmitted from the at least one medium (e.g., the NV memory 120), and the signal bits and the parity bits may be regarded as transmitted bits, but the present invention is not limited thereto. According to some embodiments, it may not be necessary for all bits within the code word to be completely transmitted from the at least one medium (e.g., the NV memory 120) are not necessary, and a portion of operations of the min-sum-algorithm-based column-layered decoding method may be modified for effectively obtaining error-free data.

Figure 6B:
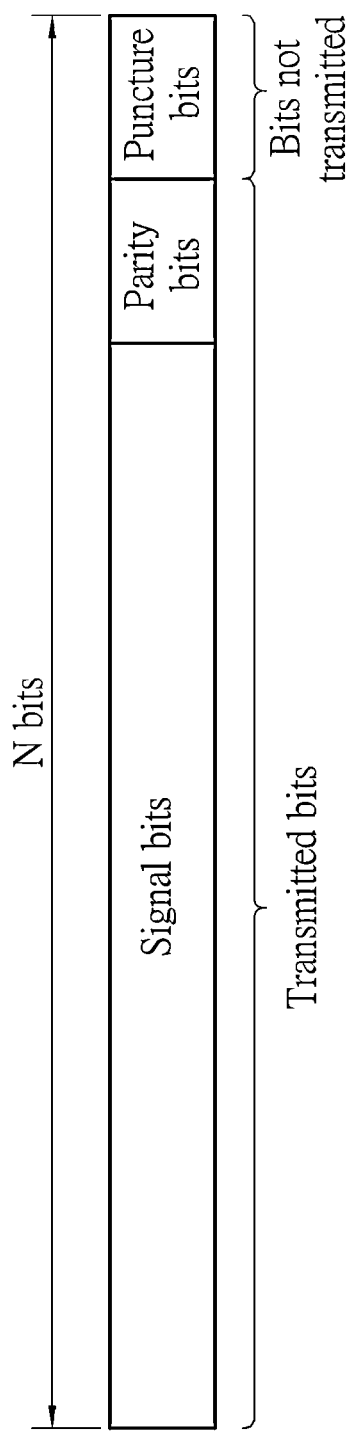
FIG. 6B is a diagram illustrating a condition that a portion of the multiple parity bits shown in FIG. 6A become puncture bits according to an embodiment of the present invention.

FIG. 6B is a diagram illustrating a condition that a portion of the multiple parity bits shown in FIG. 6A become puncture bits according to an embodiment of the present invention. For example, a portion of bits within the code word, such as all signal bits and a portion of parity bits, may be completely transmitted from the at least one medium (e.g., the NV memory 120), and the all signal bits and the portion of parity bits may be regarded as the transmitted bits. In addition, since one or more reasons (e.g., at least one unexpected factor, at least one expected factor, and/or at least one predetermined transmitting rule), another portion of bits within the code word, such as these puncture bits, have not been transmitted from the at least one medium (e.g., the NV memory 120). Under this situation, assume that all of the above-mentioned operations of the min-sum-algorithm-based column-layered decoding method are performed. This seems to be very inefficient for certain time-limited scenarios. For example, the N bits of the code word may be divided into the G groups $\{N_0, N_1, \ldots, N_{G-1}\}$, such as the G column segments CK(0), CK(1), ..., and CK(G−1), and the parity check matrix H may be divided into the G block columns, such as the $0^{th}$ block column composed of the fundamental matrices $\{B_{0,0}, B_{1,0}, \ldots, B_{F-1,0}\}$ shown in FIG. 5A, the $1^{st}$ block column composed of the fundamental matrices $\{B_{0,1}, B_{1,1}, \ldots, B_{F-1,1}\}$ shown in FIG. 5A, ..., and the $(G-1)^{th}$ block column composed of the fundamental matrices $\{B_{0,G-1}, B_{1,G-1}, \ldots, B_{F-1,G-1}\}$ shown in FIG. 5A (e.g., if F=4 and G=7, the $0^{th}$ block column composed of the fundamental matrices $\{B_{0,0}, B_{1,0}, B_{2,0}, B_{3,0}\}$ shown in FIG. 5C, the $1^{st}$ block column composed of the fundamental matrices $\{B_{0,1}, B_{1,1}, B_{2,1}, B_{3,1}\}$ shown in FIG. 5C, and the $6^{th}$ block column composed of the fundamental matrices $\{B_{0,6}, B_{1,6}, B_{2,6}, B_{3,6}\}$ shown in FIG. 5C), wherein as shown in the second layer of For-loop corresponding to a loop index g (e.g., g=0, 1, ..., (G−1)), the min-sum-algorithm-based column-layered decoding method may include related LDPC code decoding operations regarding the G groups $\{N_0, N_1, \ldots, N_{G-1}\}$ (e.g., the G column segments CK(0), CK(1), ..., and CK(G−1) (or the G block columns)). According to some embodiments, a portion of the above-mentioned operations of the min-sum-algorithm-based column-layered decoding method may be modified, and more particularly, may be modified to selectively perform corresponding LDPC code decoding operations regarding one or more groups $\{N_g\}$ (e.g., one or more column segments $\{CK(g)\}$) in at least one iteration, rather than perform all LDPC code decoding operations regarding all groups $\{N_g\}$ in the G groups $\{N_0, N_1, \ldots, N_{G-1}\}$ (e.g., all column segments $\{CK(g)\}$ in the G column segments CK(0), CK(1), ..., and CK(G−1)), for effectively obtaining error-free data.

Figure 7:
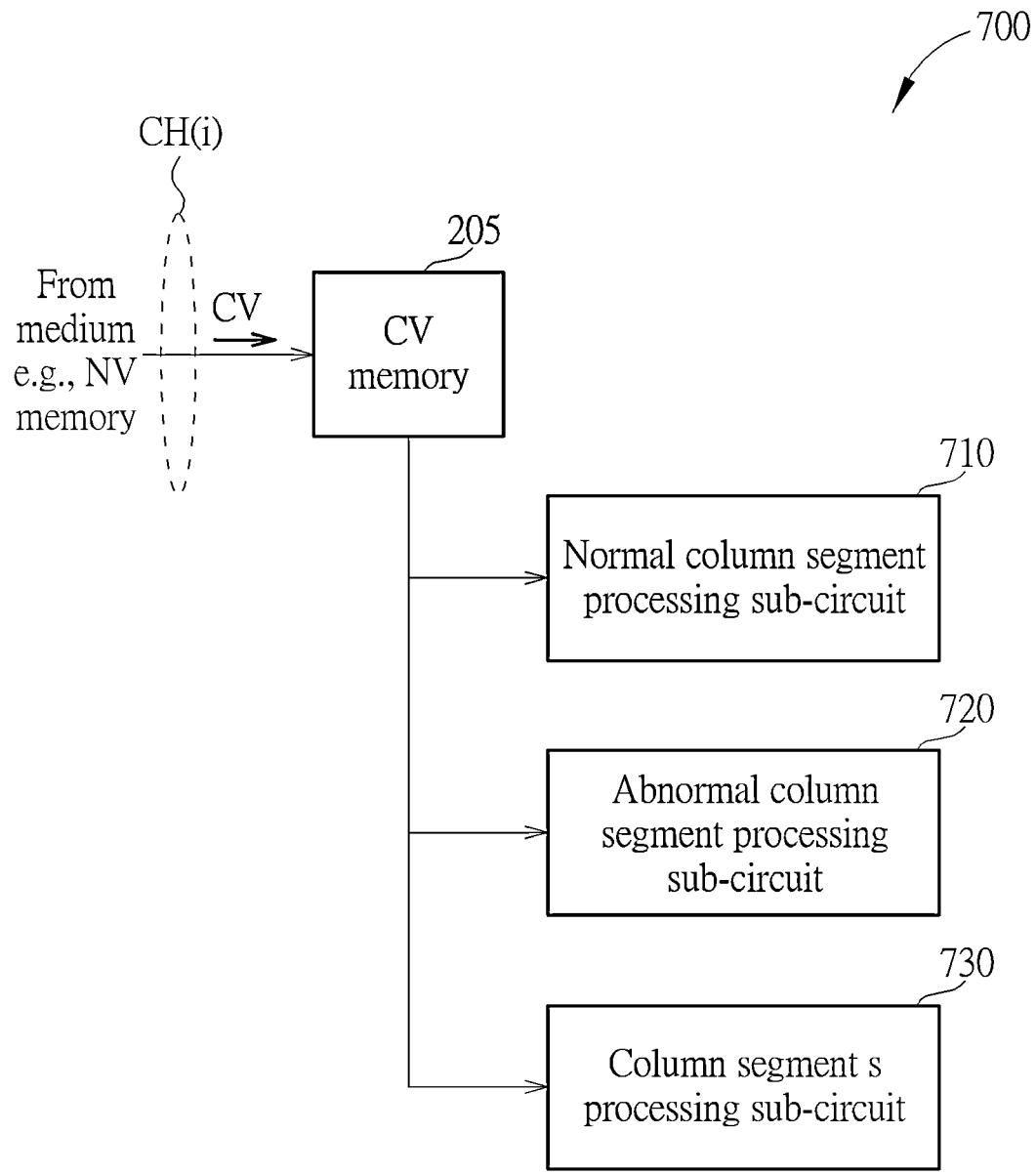
FIG. 7 is a diagram illustrating a rearrangement decoding control scheme of a method for performing data access control for a host device according to an embodiment of the present invention.

FIG. 7 is a diagram illustrating a rearrangement decoding control scheme of a method for performing data access control for a host device (e.g., the host device 50) according to an embodiment of the present invention, wherein an LDPC code decoding circuit 700 may be regarded as an example of the at least one LDPC code decoding circuit 114D, but the present invention is not limited thereto. For better comprehension, the at least one iteration may include a single iteration (e.g., the $2^{nd}$ iteration corresponding to Iter=2) for achieving the optimal overall performance, but the present invention is not limited thereto. For example, the single iteration may be another iteration corresponding to Iter>2. In some examples, the at least one iteration may include multiple iterations.

Based on the rearrangement decoding control scheme shown in FIG. 7, the multiple data processing sub-circuits within the memory controller 110 may include at least one LDPC code decoding circuit 700 corresponding to the at least one channel CH, and more particularly, may include multiple LDPC code decoding circuits {700} corresponding to the channels {CH(i)}, respectively. For example, the LDPC code decoding circuit 700 corresponding to the channel CH(i) among the LDPC code decoding circuits {700} may include the NV memory (e.g., the CV memory 205), and may include multiple column segment processing sub-circuits (e.g., the normal column segment processing sub-circuit 710, the abnormal column segment processing sub-circuit 720, and the column segment s processing sub-circuit 730), wherein any of the multiple column segment processing sub-circuits may be implemented by the column segment processing sub-circuit shown in FIG. 2A (which includes the VNU 210, the BS circuits 221 and 222, and the CNU 230).

Compared with the LDPC code decoding circuit 200 shown in FIG. 2A, the LDPC code decoding circuit 700 may utilize the normal column segment processing sub-circuit 710 and the abnormal column segment processing sub-circuit 720 to perform LDPC code decoding operations regarding normal column segments and abnormal column segments, respectively, in the $1^{st}$ iteration corresponding to Iter=1, and utilize the column segment s processing sub-circuit 730 to selectively perform corresponding LDPC code decoding operations regarding the one or more column segments {CK(g)} within the code word in the 2nd iteration corresponding to Iter=2, rather than perform all LDPC code decoding operations regarding all column segments {CK(g)} within the code word. In addition, the LDPC code decoding circuit 700 may utilize the normal column segment processing sub-circuit 710 and the abnormal column segment processing sub-circuit 720 to perform LDPC code decoding operations regarding normal column segments and abnormal column segments, respectively, in at least one subsequent iteration corresponding to Iter>2. Since the LDPC code decoding circuit 700 decodes the one or more column segments {CK(g)} in a higher priority order in the at least one iteration (e.g., the 2nd iteration corresponding to Iter=2), related decoding parameters can be rapidly converged to improve overall decoding speed.

Figure 8A:
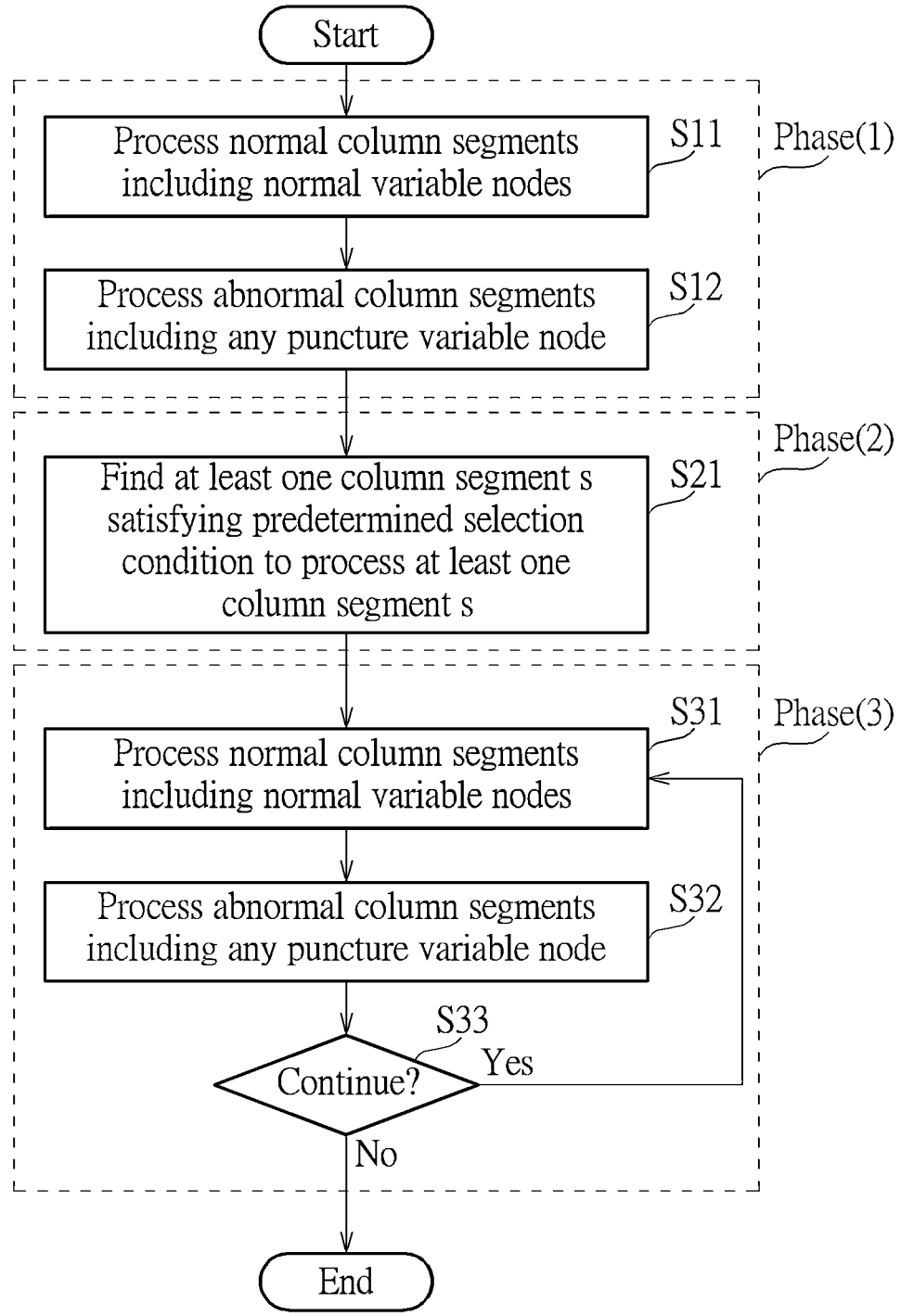
FIG. 8A is a diagram illustrating a working flow of the rearrangement decoding control scheme shown in FIG. 7 according to an embodiment of the present invention.

FIG. 8A is a diagram illustrating a working flow of the rearrangement decoding control scheme shown in FIG. 7 according to an embodiment of the present invention. The LDPC code decoding circuit 700 may operate according to the working flow shown in FIG. 8A, and more particularly, may perform Steps S11 and S12, Step S21, and Steps S31-S33 in multiple decoding phases (e.g., phases Phase(1), Phase(2), and Phase(3)), respectively, wherein the phase Phase(1) may correspond to Iter=1, the phase Phase(2) may correspond to Iter=2, and the phase Phase(3) may correspond to Iter>2, but the present invention is not limited thereto.

In Step S11, the LDPC code decoding circuit 700 may utilize the normal column segment processing sub-circuit 710 to process normal column segments that include (or correspond to) normal variable nodes {v} (e.g., non-puncture variable nodes {v}, such as variable nodes {v} corresponding to the signal bits and the parity bits shown in FIG. 6B), and more particularly, to perform LDPC code decoding operations regarding the normal column segments in the $1^{st}$ iteration corresponding to Iter=1. For example, the v axis may be illustrated in FIG. 6B, along with the arrangement direction of the N bits of the code word, to indicate the above-mentioned normal variable nodes {v} among all variable nodes {v}.

In Step S12, the LDPC code decoding circuit 700 may utilize the abnormal column segment processing sub-circuit 720 to process abnormal column segments that include (or correspond to) any puncture variable nodes {v} (e.g., variable nodes {v} corresponding to the puncture bits shown in FIG. 6B), and more particularly, to perform LDPC code decoding operations regarding the abnormal column segments in the $1^{st}$ iteration corresponding to Iter=1. For example, the v axis may be illustrated in FIG. 6B, along with the arrangement direction of the N bits of the code word, to indicate the above-mentioned puncture variable nodes {v} among all variable nodes {v}.

In Step S21, the LDPC code decoding circuit 700 may utilize the column segment s processing sub-circuit 730 to find at least one column segment s that satisfies at least one predetermined selection condition to process the at least one column segment s, and more particularly, to selectively perform corresponding LDPC code decoding operations regarding the at least one column segment s (e.g., the one or more column segments {CK(g)}) in the $2^{nd}$ iteration corresponding to Iter=2, rather than perform all LDPC code decoding operations regarding all column segments {CK(g)} within the code word.

In Step S31, the LDPC code decoding circuit 700 may utilize the normal column segment processing sub-circuit 710 to process normal column segments that include (or correspond to) normal variable nodes {v} (e.g., variable nodes {v} corresponding to the signal bits and the parity bits shown in FIG. 6B), and more particularly, to perform LDPC code decoding operations regarding the normal column segments in the Iter iteration corresponding to Iter>2.

In Step S32, the LDPC code decoding circuit 700 may utilize the abnormal column segment processing sub-circuit 720 to process abnormal column segments that include (or correspond to) any puncture variable nodes {v} (e.g., variable nodes {v} corresponding to the puncture bits shown in FIG. 6B), and more particularly, to perform LDPC code decoding operations regarding the abnormal column segments in the Iter iteration corresponding to Iter>2.

In Step S33, the LDPC code decoding circuit 700 may determine whether to continue to a next iteration. If Yes, Step S31 is entered; if No, the working flow shown in FIG. 8A ends. For example, the LDPC code decoding circuit 700 may make the hard decision according to the sign of LV to determine whether any valid code word is found. When any valid code word has not been found, the LDPC code decoding circuit 700 may continue to the next iteration until the valid code word is found or Iter=Iter maximum.

For better comprehension, the method may be illustrated with the working flow shown in FIG. 8A, but the present invention is not limited thereto. According to some embodiments, one or more steps may be added, deleted, or changed in the working flow shown in FIG. 8A.

Figure 8B:
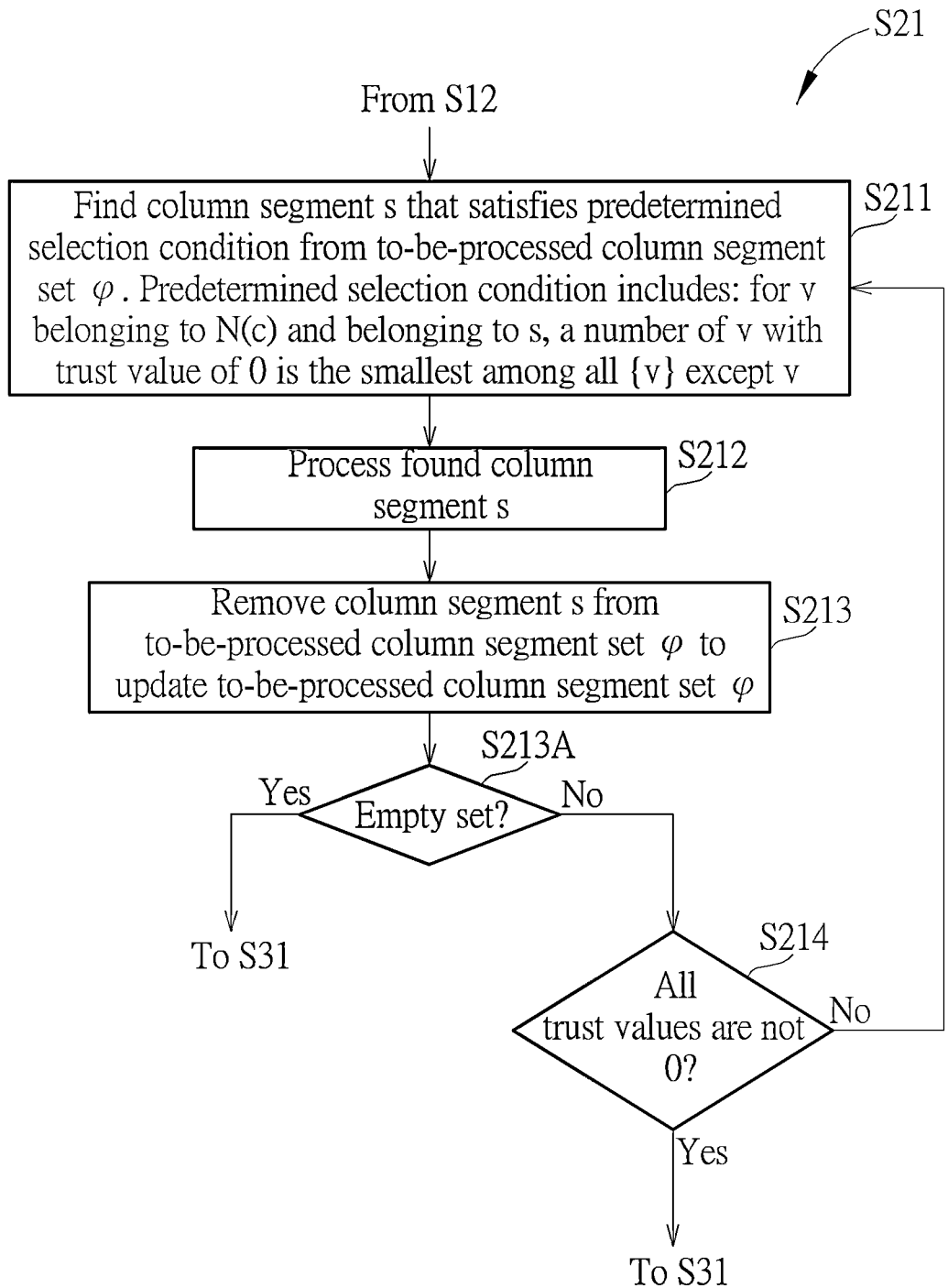
FIG. 8B is a diagram illustrating some implementation details of the working flow shown in FIG. 8A according to an embodiment of the present invention.

FIG. 8B is a diagram illustrating some implementation details of the working flow shown in FIG. 8A according to an embodiment of the present invention, wherein Step S21 shown in FIG. 8A may include multiple sub-steps, such as Steps S211-S213, S213A, and S214 shown in FIG. 8B, but the present invention is not limited thereto. In addition, in the $2^{nd}$ iteration corresponding to Iter=2, when Step S211 is executed for the first time, a to-be-processed column segment set p may include all column segments {CK(g)} within the code word (e.g., the G column segments CK(0), CK(1), . . . , and CK(G−1)).

In Step S211, the LDPC code decoding circuit 700 may utilize the column segment s processing sub-circuit 730 to find a column segment s (e.g., a column segment CK(g)) that satisfies the at least one predetermined selection condition from the to-be-processed column segment set p. The at least one predetermined selection condition includes: for a variable node v belonging to a set N(c) and belonging to a column segment s, a number of variable nodes {v} with a trust value of 0 is the smallest among all variable nodes {v} except the variable node v. For example, the at least one predetermined selection condition may be represented by the following equation:

$$\underset{s\in\varphi}{\mathrm{argmin}}\{(c, v)|\forall\, c, v\in N(c), v\in s, \min_{n\in N(c)\backslash v}|L_{cn}| = 0\} \quad \text{Eq (4)}$$

but the present invention is not limited thereto. According to some embodiments, the Eq(4) may vary.

In Step S212, the LDPC code decoding circuit 700 may utilize the column segment s processing sub-circuit 730 to process the found column segment s (e.g., the column segment CK(g)), and more particularly, to perform a corresponding LDPC code decoding operation regarding the column segment s. For example, the corresponding LDPC code decoding operation may include the horizontal decoding operation (or the horizontal step) and the vertical decoding operation (or the vertical step).

In Step S213, the LDPC code decoding circuit 700 may utilize the column segment s processing sub-circuit 730 to remove the column segment s from the to-be-processed column segment set p to update the to-be-processed column segment set p.

In Step S213A, the LDPC code decoding circuit 700 may utilize the column segment s processing sub-circuit 730 to check whether the updated to-be-processed column segment set p is an empty set. If Yes, Step S31 is entered; if No, Step S214 is entered.

In Step S214, the LDPC code decoding circuit 700 may utilize the column segment s processing sub-circuit 730 to check whether all trust values are not 0. If Yes, Step S31 is entered; if No, Step s211 is entered. For example, the check operation of Step S214 may be represented by the following equation:

$$\forall\, c, \forall\, v, \min_{n\in N(c)\backslash v}|L_{cn}| \ne 0 \quad \text{Eq (5)}$$

wherein "|Lcn|" may represent trust values corresponding to the check node c and a variable $n \in N(c)\backslash v$ (e.g., the variable n belongs to all variable nodes $\{v\}$ except the variable node v in the set N(c)), but the present invention is not limited thereto. According to some embodiments, the equation Eq(5) may vary.

For better comprehension, the related details of the method may be illustrated by the working flow shown in FIG. 8B, but the present invention is not limited thereto. According to some embodiments, one or more steps may be added, deleted, or changed in the working flow shown in FIG. 8B. For example, Step S213A may be deleted from the working flow shown in FIG. 8B, and related partial flows may be correspondingly modified; more particularly, Step S214 may be directly entered after Step S213 is executed. Typically, under a condition that abnormal column segments corresponding to puncture variable nodes exist, the determination result "Yes" of Step S214 may be obtained after Steps S211 and S212 are executed a small number of times, or even after Steps S211 and S212 are executed for the first time. As a result, deleting Step S213A may further improve the overall performance. For brevity, similar descriptions for these embodiments are not repeated in detail here.

According to some embodiments, in the $2^{nd}$ iteration corresponding to Iter=2, the second layer of For-loop corresponding to the loop index g (e.g., g=0, 1, ..., (G−1)) may be modified to select the column segment CK(g) satisfying the at least one predetermined selection condition first for acting as the column segment s satisfying the at least one predetermined selection condition (as mentioned in Step S211), to perform the horizontal decoding operation (or the horizontal step) and the vertical decoding operation (or the vertical step) for the selected column segment CK(g) (or the found column segment s), wherein similar operations may be performed until the condition defined by the equation Eq(5) is satisfied. For brevity, similar descriptions for these embodiments are not repeated in detail here.

FIG. 9 is a diagram illustrating a relationship between some to-be-processed column segments (e.g., column segments a and b) and elements within the parity check matrix H in the method according to an embodiment of the present invention. For example, assume that "f" may represent any integer in an interval [0, (F−1)]. When Z=3, in the multiple fundamental matrices {B} within the parity check matrix H, a fundamental matrix $B_{f,a}$ located at the $a^{th}$ block column may correspond to the column segment a, and a fundamental matrix $B_{f,b}$ located at the $b^{th}$ block column may correspond to the column segment b. In addition, each of the fundamental matrices $B_{f,a}$ and $B_{f,b}$ may be the identity matrix $I_Z$ (e.g., an identity matrix $I_3$ when Z=3), and the to-be-processed column segment set p mentioned in Step S211 may include the column segments a and b. Assume that a puncture bits count of the code word may be equal to ((a*Z)+2) (e.g., ((3*a)+2) when Z=3), the first two elements on the main diagonal of the fundamental matrix $B_{f,a}$ may be elements corresponding to the normal variable nodes and being equal to 1 in the parity check matrix H, and the third element on the main diagonal of the fundamental matrix $B_{f,a}$ and third elements on the main diagonal of the fundamental matrix $B_{f,b}$ may be elements corresponding to the puncture variable nodes and being equal to 1 in the parity check matrix H, wherein the column segment b satisfies the at least one predetermined selection condition, and the column segment a does not satisfy the at least one predetermined selection condition, but the present invention is not limited thereto. According to some embodiments, the parity check matrix H, the to-be-processed column segments (e.g., the column segments a and b), and/or the size of each column segment may vary. For brevity, similar descriptions for this embodiment are not repeated in detail here.

According to some embodiments, the method may be applied to any data access device of various data access devices, and more particularly, may be applied to a controller within the any data access device. For example, the at least one medium may include a storage medium (e.g., the NV memory 120), the any data access device may represent the memory device 100, and the controller may represent the memory controller 110, but the present invention is not limited thereto. In some examples, the at least one medium may include a transmission medium, and the any data access device may include a combination or one of an optical fiber transceiving device, a wired network transceiving device, and a wireless network transceiving device.

Figure 10:
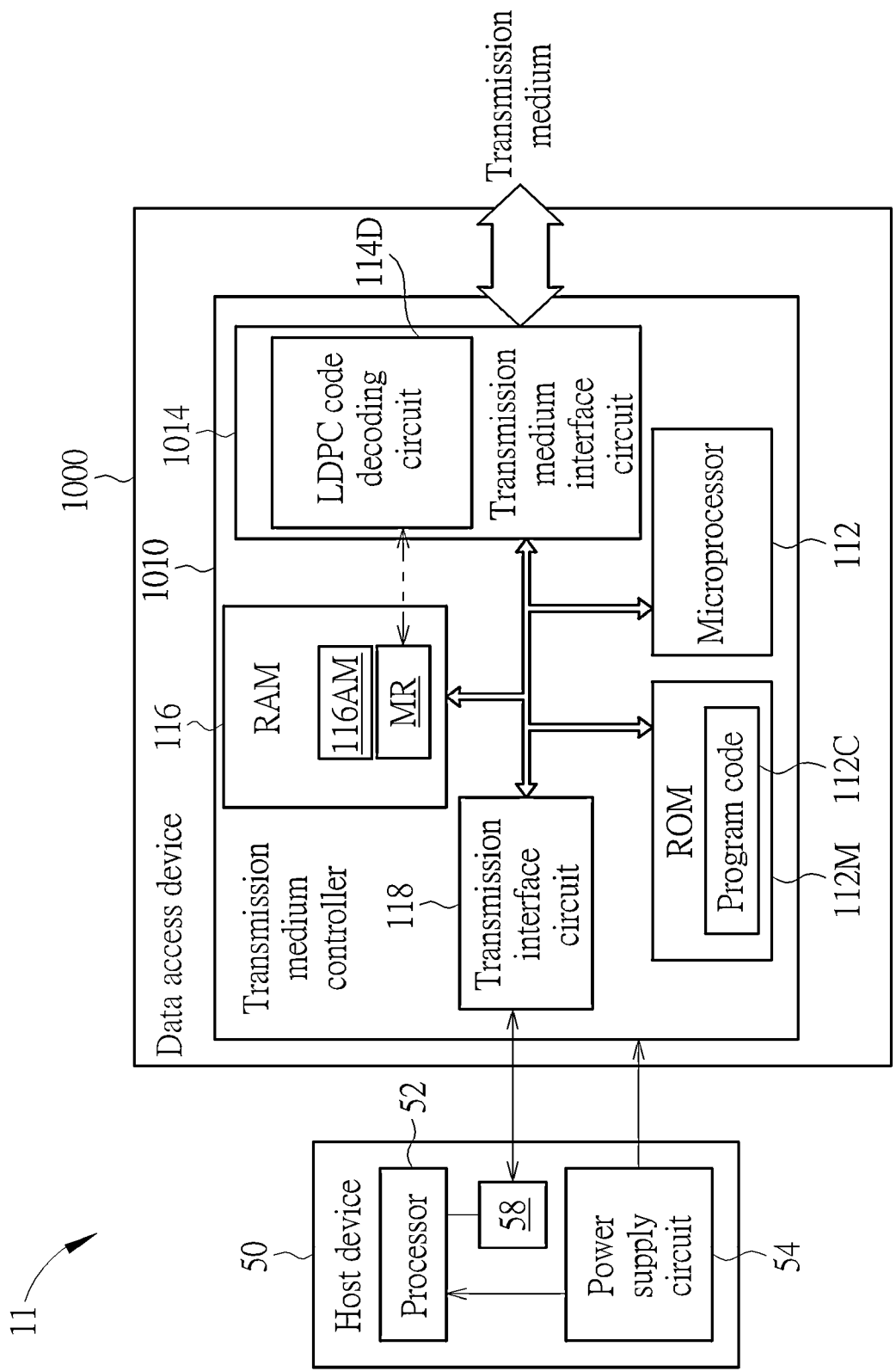
FIG. 10 is a diagram illustrating an electronic device involved in the method according to an embodiment of the present invention, wherein the electronic device may include a data access device.

FIG. 10 is a diagram illustrating an electronic device 11 involved in the method according to an embodiment of the present invention, wherein the electronic device 11 may include a data access device 1000 that may be regarded as an example of the data access device. Compared with the architecture shown in FIG. 1, a transmission medium controller 1010 and a transmission medium interface circuit 1014 within the data access device 1000 replace the memory controller 110 and the control logic circuit 114, and the transmission medium interface circuit 1014 may be arranged to control data access operations performed upon the transmission medium by the data access device 1000 (e.g., data transmission operations and data reception operations), wherein the transmission medium interface circuit 1014 may include the at least one LDPC code decoding circuit 114D. For brevity, similar descriptions for this embodiment are not repeated in detail here.

Figure 11A:
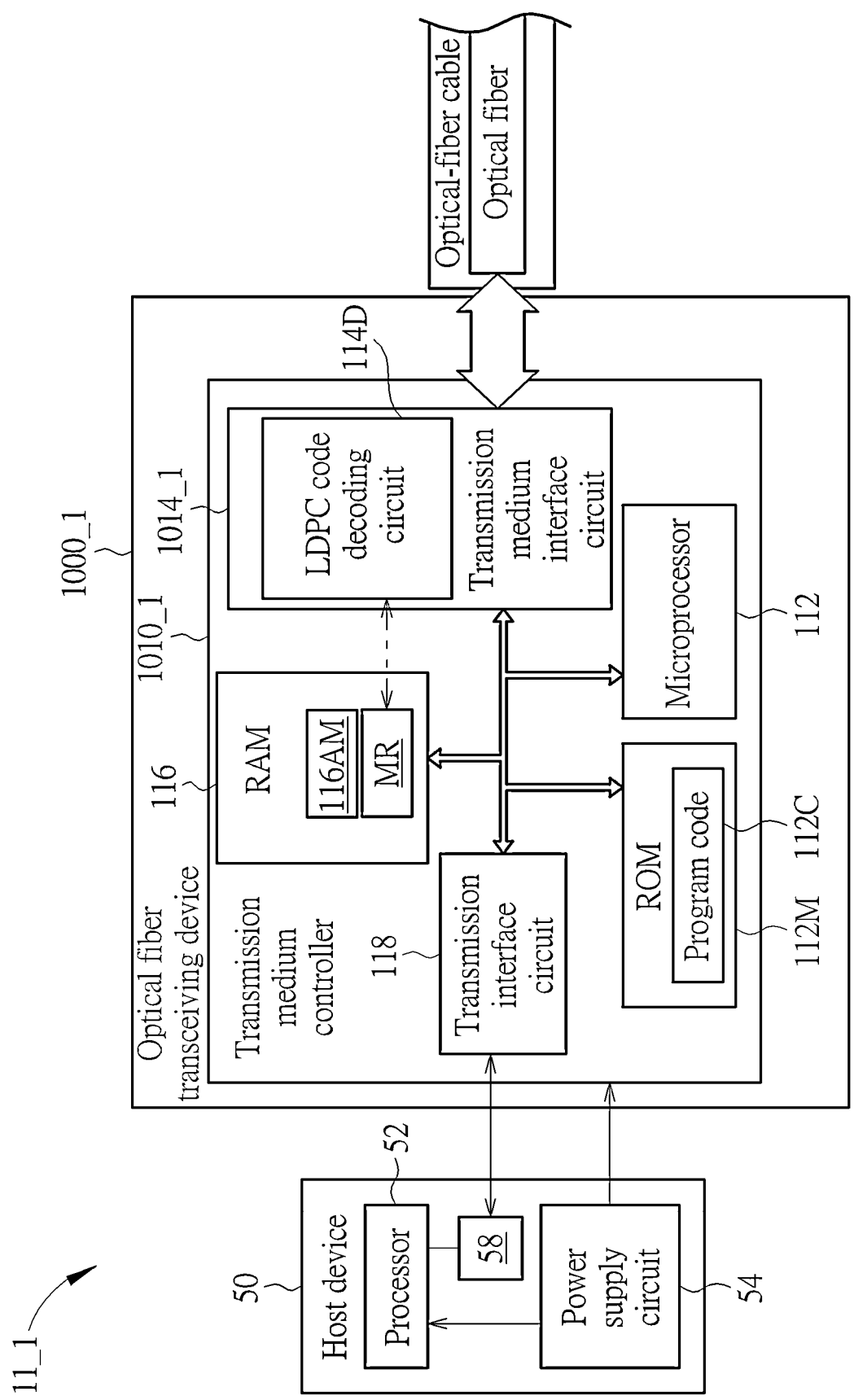
FIG. 11A is a diagram illustrating an electronic device involved in the method according to another embodiment of the present invention, wherein the electronic device may include an optical fiber transceiving device.

FIG. 11A is a diagram illustrating an electronic device 11_1 involved in the method according to another embodiment of the present invention, wherein the electronic device 11_1 may include an optical fiber transceiving device 1000_1, and the optical fiber transceiving device 1000_1 may be regarded as an example of the any data access device, and may also be regarded as an example of the data access device 1000 shown in FIG. 10. The transmission medium may include an optical-fiber cable, wherein the optical-fiber cable includes at least one optical fiber. A transmission medium controller 1010_1 of the optical fiber transceiving device 1000_1 may include a transmission medium interface circuit 1014_1, and the transmission medium interface circuit 1014_1 may be arranged to control data access operations performed upon the optical-fiber cable by the optical fiber transceiving device 1000_1 (e.g., data transmission operations and data reception operations), wherein the transmission medium interface circuit 1014_1 may include the at least one LDPC code decoding circuit 114D. For brevity, similar descriptions for this embodiment are not repeated in detail here.

Figure 11B:
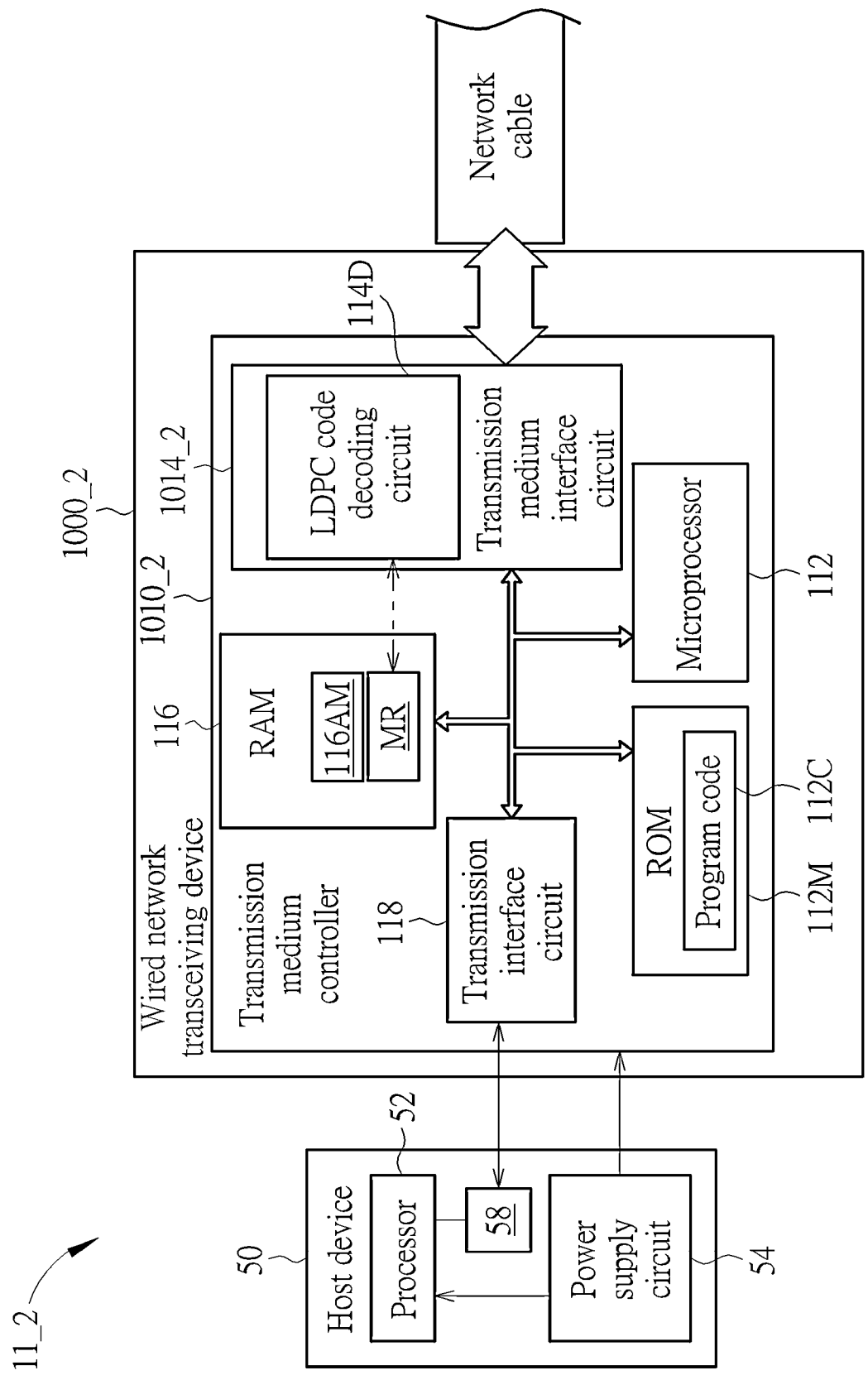
FIG. 11B is a diagram illustrating an electronic device involved in the method according to yet another embodiment of the present invention, wherein the electronic device may include a wired network transceiving device.

FIG. 11B is a diagram illustrating an electronic device 11_2 involved in the method according to yet another embodiment of the present invention, wherein the electronic device 11_2 may include a wired network transceiving device 1000_2, and the wired network transceiving device 1000_2 may be regarded as an example of the data access device, and may also be regarded as an example of the data access device 1000 shown in FIG. 10. The transmission medium may include a network cable. A transmission medium controller 1010_2 of the wired network transceiving device 1000_2 may include a transmission medium interface circuit 1014_2, and the transmission medium interface circuit 1014_2 may be arranged to control data access operations performed upon the network cable by the wired network transceiving device 1000_2 (e.g., data transmission operations and data reception operations), wherein the transmission medium interface circuit 1014_2 may include the at least one LDPC code decoding circuit 114D. For brevity, similar descriptions for this embodiment are not repeated in detail here.

Figure 11C:
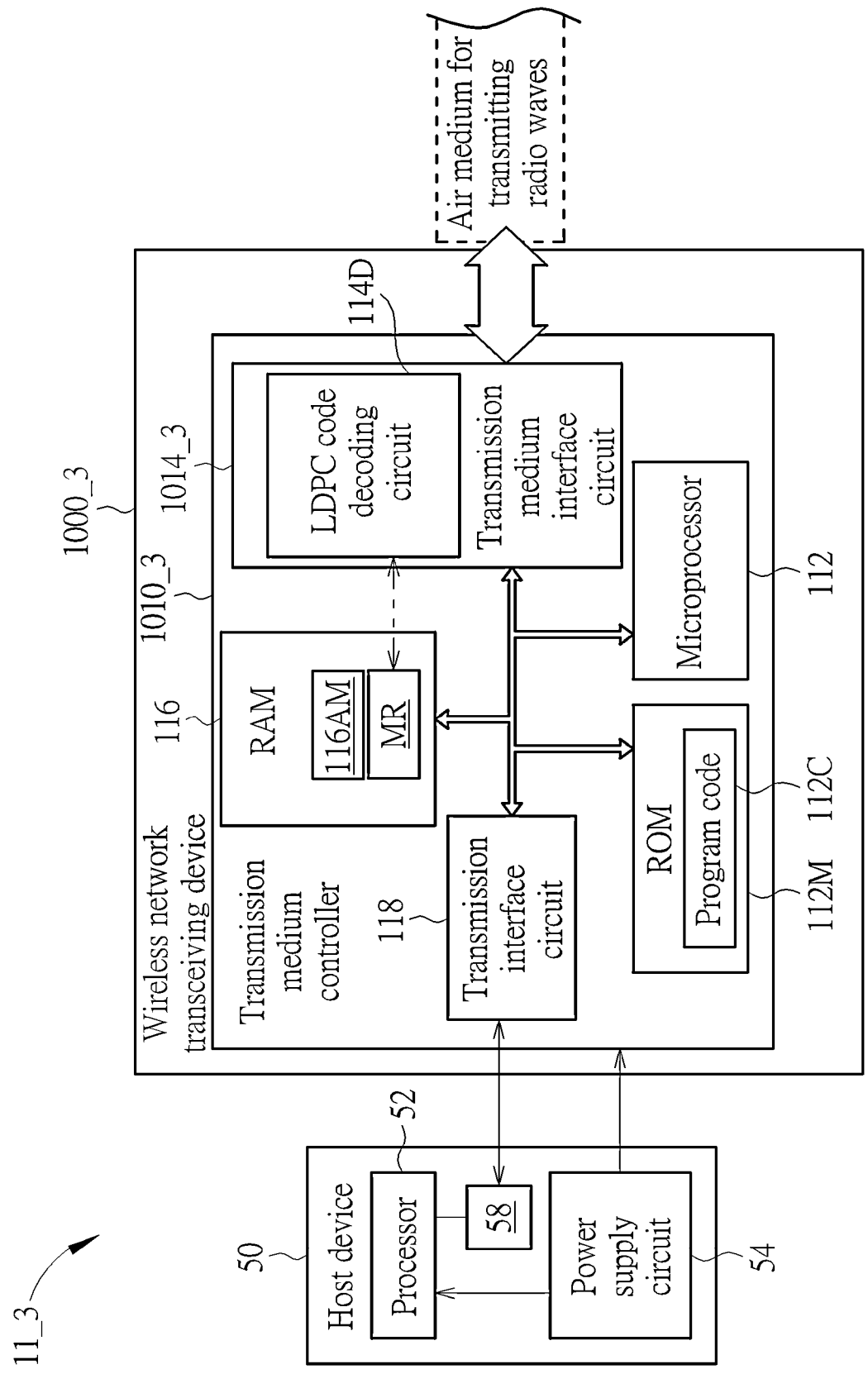
FIG. 11C is a diagram illustrating an electronic device involved in the method according to yet another embodiment of the present invention, wherein the electronic device may include a wireless network transceiving device.

FIG. 11C is a diagram illustrating an electronic device 11_3 involved in the method according to yet another embodiment of the present invention, wherein the electronic device 11_3 may include a wireless network transceiving device 1000_3, and the wireless network transceiving device 1000_3 may be regarded as an example of the data access device, and may also be regarded as an example of the data access device 1000 shown in FIG. 10. The transmission medium may include an air medium for transmitting radio waves. A transmission medium controller 1010_3 of the wireless network transceiving device 1000_3 may include a transmission medium interface circuit 1014_3, and the transmission medium interface circuit 1014_3 may be arranged to control data access operations performed upon the air medium by the wireless network transceiving device 1000_3 (e.g., data transmission operations and data reception operations), wherein the transmission medium interface circuit 1014_3 may include the at least one LDPC code decoding circuit 114D. For brevity, similar descriptions for this embodiment are not repeated in detail here.

Figure 12:
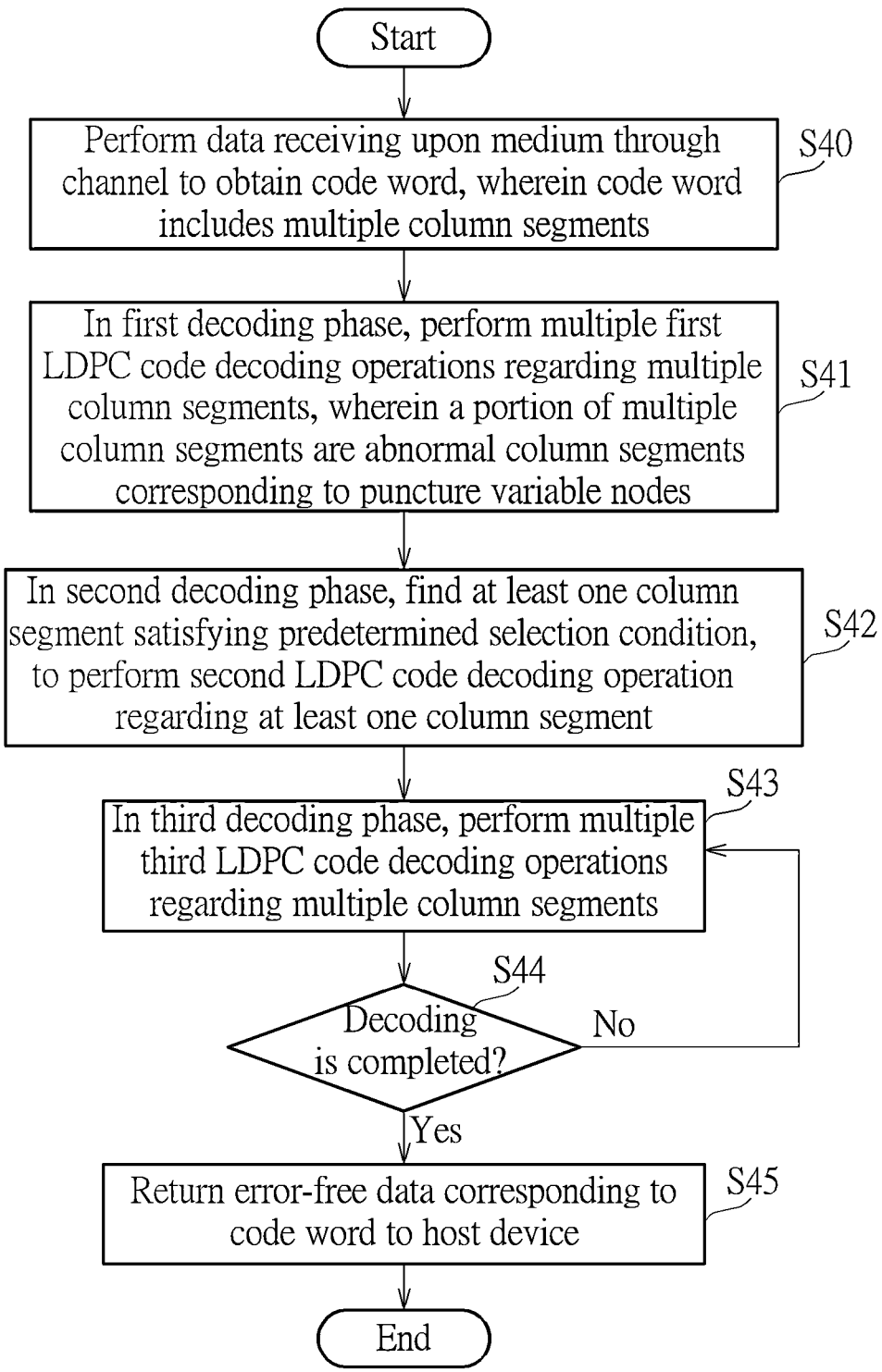
FIG. 12 is a diagram illustrating a working flow of a data access optimization procedure of the method according to an embodiment of the present invention.

FIG. 12 is a diagram illustrating a working flow of a data access optimization procedure (e.g., the read optimization procedure) of the method according to an embodiment of the present invention. The data access device, such as the memory device 100 for accessing the storage medium (e.g., the NV memory 120) and the data access device 1000 (e.g., the data access devices 1000_1, 1000_2, and 1000_3) for accessing the transmission medium, may receive the plurality of host commands from the host device 50 for performing data access upon the at least one medium according to the plurality of host commands, and perform the data access optimization procedure according to the working flow shown in FIG. 12 for maintaining correctness of data receiving, wherein the data access may include the data receiving. For example, when the data access device represents the memory device 100, the plurality of host commands may include at least one read command, and the data receiving may include data reading, but the present invention is not limited thereto.

In Step S40, the any data access device (e.g., the memory device 100 or the data access device 1000) may perform the data receiving upon the at least one medium through the at least one channel CH(i) to obtain at least one code word, wherein the at least one code word may include multiple column segments {CK(g)}.

In Step S41, the data access device (e.g., the memory device 100 or the data access device 1000) may perform multiple first LDPC code decoding operations regarding the column segments {CK(g)} in a first decoding phase (e.g., the phase Phase(1)), wherein a portion of the column segments {CK(g)} are abnormal column segments corresponding to puncture variable nodes.

In Step S42, the data access device (e.g., the memory device 100 or the data access device 1000) may find at least one column segment s (e.g., at least one column segment CK(g)) satisfying the at least one predetermined selection condition in a second decoding phase (e.g., the phase Phase(2)), to perform at least one second LDPC code decoding operation regarding the at least one column segment, without performing any LDPC code decoding operation upon at least one remaining column segment CK(g) among the column segments {CK(g)}.

In Step S43, the any data access device (e.g., the memory device 100 or the data access device 1000) may perform multiple third LDPC code decoding operations regarding the column segments {CK(g)} in a third decoding phase (e.g., the phase Phase(3)).

In Step S44, the any data access device (e.g., the memory device 100 or the data access device 1000) may check whether decoding is completed in the third decoding phase (e.g., the phase Phase(3)). If Yes, Step S45 is entered; if No, Step S43 is entered to continue decoding.

In Step S45, after the decoding is completed, the data access device (e.g., the memory device 100 or the data access device 1000) may return error-free data corresponding to the at least one code word to the host device 50.

Any LDPC code decoding operation among the multiple first LDPC code decoding operations, the at least one second LDPC code decoding operation, and the multiple third LDPC code decoding operations may be implemented by the horizontal decoding operation and the vertical decoding operation of the min-sum-algorithm-based column-layered decoding method. For example, the horizontal decoding operation and the vertical decoding operation belong to decoding operations regarding a single column segment CK(g) in an iteration among multiple iterations. In addition, the first decoding phase may correspond to a first iteration among the multiple iterations, the second decoding phase may correspond to a second iteration among the multiple iterations, and the third decoding phase may correspond to a third iteration among the multiple iterations. More particularly, the first iteration is an initial iteration among the multiple iterations (e.g., the $1^{st}$ iteration corresponding to Iter=1), the second iteration is a next iteration of the initial iteration (e.g., the $2^{nd}$ iteration corresponding to Iter=2), and the at least one third iteration is at least one subsequent iteration of the next iteration (e.g., at least one subsequent iteration corresponding to Iter>2).

The any data access device (e.g., the memory device 100 or the data access device 1000) operated according to the method can achieve fast decoding speed and rapid convergence, so that the overall data access performance can be greatly improved under a condition that the abnormal column segments corresponding to the puncture variable nodes exist.

For better comprehension, the data access optimization procedure of the method may be illustrated with the working flow shown in FIG. 12, but the present invention is not limited thereto. According to some embodiments, one or more steps may be added, deleted, or changed in the working flow shown in FIG. 12. For example, Step S41 may include operations of Steps S11 and S12. Step S42 may include operations of Step S21, and more particularly, may include operations of at least one portion of the multiple sub-steps (e.g., Steps S211, S212, S213, and S214). Step S43 may include operations of Steps S31 and S32. Step S44 may include operations of Step S33. For brevity, similar descriptions for these embodiments are not repeated in detail here.

According to some embodiments, the at least one predetermined selection condition may include: for a variable node v belonging to a predetermined variable node set N(c) and belonging to a column segment s, a number of variable nodes v with a trust value of 0 is the smallest among all variable nodes {v} except the variable node v. In addition, the data access device (e.g., the memory device 100 or the data access device 1000) may selectively leave the second decoding phase according to whether a predetermined stopping condition of the second decoding phase is satisfied. More particularly, the predetermined stopping condition may include: the variable nodes v with the trust value of 0 no longer exist. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims

What is claimed is:

1. A method for performing data access control for a host device, the method being applied to a controller of a data access device, the method comprising:
   receiving a plurality of host commands from the host device, for performing data access upon at least one medium, which is non-transitory, according to the plurality of host commands, wherein the data access comprises data receiving; and
   performing a data access optimization procedure for maintaining correctness of the data receiving, wherein the data access optimization procedure comprises:
   performing the data receiving upon the at least one medium to obtain at least one code word, wherein the at least one code word comprises multiple column segments;
   in a first decoding phase, performing multiple first low-density parity-check (LDPC) code decoding operations regarding the multiple column segments, wherein a portion of column segments among the multiple column segments are abnormal column segments corresponding to puncture variable nodes;
   in a second decoding phase, finding at least one column segment satisfying at least one predetermined selection condition, to perform at least one second LDPC code decoding operation regarding the at least one column segment;
   in a third decoding phase, performing multiple third LDPC code decoding operations regarding the multiple column segments; and
   after a plurality of LDPC code decoding operations of the first decoding phase, the second decoding phase, and the third decoding phase, the plurality of LDPC code decoding operations comprising the multiple first LDPC code decoding operations, the at least one second LDPC code decoding operation, and the multiple third LDPC code decoding operations, is completed, returning error-free data corresponding to the at least one code word to the host device.

2. The method of claim 1, wherein the at least one medium comprises a storage medium; and the data access device represents a memory device, and the controller represents a memory controller, wherein the storage medium comprises a non-volatile (NV) memory, and the NV memory comprises at least one NV memory element.

3. The method of claim 2, wherein the plurality of host commands comprise at least one read command, and the data receiving comprises data reading.

4. The method of claim 1, wherein the at least one medium comprises a transmission medium; and the data access device comprises a combination or one of an optical fiber transceiving device, a wired network transceiving device, and a wireless network transceiving device.

5. The method of claim 1, wherein any of the multiple first LDPC code decoding operations, the at least one second LDPC code decoding operation, and the multiple third LDPC code decoding operations is implemented by a vertical decoding operation and a horizontal decoding operation of a min-sum-algorithm-based column-layered decoding method.

6. The method of claim 5, wherein the vertical decoding operation and the horizontal decoding operation belong to decoding operations regarding a single column segment in one of multiple iterations.

7. The method of claim 1, wherein the first decoding phase corresponds to a first iteration among multiple iterations, the second decoding phase corresponds to a second iteration among the multiple iterations, and the third decoding phase corresponds to at least one third iteration among the multiple iterations.

8. The method of claim 7, wherein the first iteration is an initial iteration among the multiple iterations, the second iteration is a next iteration of the initial iteration, and the at least one third iteration is at least one subsequent iteration of the next iteration.

9. The method of claim 1, wherein finding the at least one column segment satisfying the at least one predetermined selection condition in the second decoding phase to perform the at least one second LDPC code decoding operation regarding the at least one column segment further comprises:

in the second decoding phase, finding the at least one column segment satisfying the at least one predetermined selection condition, to perform the at least one second LDPC code decoding operation regarding the at least one column segment, without performing any LDPC code decoding operation upon at least one remaining column segment among the multiple column segments.

10. The method of claim 1, wherein in a beginning of the second decoding phase, a to-be-processed column segment set comprises the multiple column segments; and finding the at least one column segment satisfying the at least one predetermined selection condition in the second decoding phase to perform the at least one second LDPC code decoding operation regarding the at least one column segment further comprises:

finding any column segment satisfying the at least one predetermined selection condition in the to-be-processed column segment set;

performing a second LDPC code decoding operation regarding the any column segment;

removing the any column segment from the to-be-processed column segment set to update the to-be-processed column segment set; and selectively leaving the second decoding phase according to whether a predetermined stopping condition of the second decoding phase is satisfied.

11. The method of claim 10, wherein the at least one predetermined selection condition comprises: for a variable node belonging to a predetermined variable node set and belonging to the any column segment, a number of variable nodes with a trust value of 0 is the smallest among all variable nodes except the variable node.

12. The method of claim 11, wherein the predetermined stopping condition comprises: the variable nodes with the trust value of 0 no longer exist.

13. A controller of a data access device, the data access device arranged to perform data access control for a host device, the controller comprising:

a processing circuit, arranged to control the controller according to a plurality of host commands from the host device, to allow the host device to access at least one medium, which is non-transitory, through the controller;

a transmission interface circuit, arranged to perform communications with the host device; and a low-density parity-check (LDPC) code decoding circuit, arranged to perform LDPC code decoding;

wherein:

the controller receives the plurality of host commands from the host device through the transmission interface circuit within the controller, for performing data access upon the at least one medium according to the plurality of host commands, wherein the data access comprises data receiving; and the controller performs a data access optimization procedure for maintaining correctness of the data receiving, wherein the data access optimization procedure comprises:

performing the data receiving upon the at least one medium to obtain at least one code word, wherein the at least one code word comprises multiple column segments;

in a first decoding phase, utilizing the LDPC code decoding circuit to perform multiple first LDPC code decoding operations regarding the multiple column segments, wherein a portion of column segments among the multiple column segments are abnormal column segments corresponding to puncture variable nodes;

in a second decoding phase, utilizing the LDPC code decoding circuit to find at least one column segment satisfying at least one predetermined selection condition, to perform at least one second LDPC code decoding operation regarding the at least one column segment;

in a third decoding phase, utilizing the LDPC code decoding circuit to perform multiple third LDPC code decoding operations regarding the multiple column segments; and after a plurality of LDPC code decoding operations of the first decoding phase, the second decoding phase, and the third decoding phase, the plurality of LDPC code decoding operations comprising the multiple first LDPC code decoding operations, the at least one second LDPC code decoding operation, and the multiple third LDPC code decoding operations, is completed, returning error-free data corresponding to the at least one code word to the host device.

14. The controller of claim 13, wherein the at least one medium comprises a storage medium; and the data access device represents a memory device, and the controller represents a memory controller, wherein the storage medium comprises a non-volatile (NV) memory, and the NV memory comprises at least one NV memory element.

15. The controller of claim 13, wherein the at least one medium comprises a transmission medium; and the data access device comprises a combination or one of an optical fiber transceiving device, a wired network transceiving device, and a wireless network transceiving device.

16. A data access device comprising the controller of claim 13, wherein the data access device comprises:

the controller, arranged to control operations of the data access device.

17. The data access device of claim 16, wherein the at least one medium comprises a storage medium, the data access device represents a memory device, and the controller represents a memory controller, wherein the storage medium comprises a non-volatile (NV) memory, and the NV memory comprises at least one NV memory element; and the memory device comprises:

the NV memory, arranged to store information; and the memory controller, coupled to the NV memory, arranged to control operations of the memory device.

18. The data access device of claim 16, wherein the at least one medium comprises a transmission medium; and the data access device comprises a combination or one of an optical fiber transceiving device, a wired network transceiving device, and a wireless network transceiving device.

19. An electronic device comprising the data access device of claim 16, and further comprising:

the host device, coupled to the memory device, wherein the host device comprises:

at least one processor, arranged to control operations of the host device; and a power supply circuit, coupled to the at least one processor, arranged to provide power to the at least one processor and the data access device.

* * * * *